United States Patent
Kanazawa et al.

(10) Patent No.: US 7,087,325 B2
(45) Date of Patent: Aug. 8, 2006

(54) MAGNETIC RECORDING MEDIUM AND PRODUCTION PROCESS THEREOF

(75) Inventors: Hiroshi Kanazawa, Chiba (JP); Hiroshi Sakai, Chiba (JP); Hiroshi Ohsawa, Chiba (JP); Kazunori Ohnami, Tokyo (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 22 days.

(21) Appl. No.: 10/361,827

(22) Filed: Feb. 11, 2003

(65) Prior Publication Data

US 2004/0050688 A1 Mar. 18, 2004

Related U.S. Application Data

(62) Division of application No. 09/715,166, filed on Nov. 20, 2000, now abandoned.

(60) Provisional application No. 60/184,335, filed on Feb. 23, 2000.

(51) Int. Cl.
*B32B 5/66* (2006.01)
*B32B 5/70* (2006.01)

(52) U.S. Cl. .................. 428/836.1; 428/828

(58) Field of Classification Search .......... 428/694 TS, 428/694 T, 694 TM, 900, 828, 827, 832.1, 428/836.1
See application file for complete search history.

(56) References Cited

U.S. PATENT DOCUMENTS

| | | | |
|---|---|---|---|
| 5,006,388 A | 4/1991 | Kuzuo et al. | |
| 5,447,781 A | 9/1995 | Kano et al. | |
| 5,679,473 A * | 10/1997 | Murayama et al. | 428/694 T |
| 5,750,270 A | 5/1998 | Tang et al. | |
| 5,759,617 A * | 6/1998 | Mukai | 427/130 |
| 5,762,766 A | 6/1998 | Kurita et al. | |
| 5,789,088 A * | 8/1998 | Nakai et al. | 428/611 |

FOREIGN PATENT DOCUMENTS

| | | |
|---|---|---|
| JP | 1-232522 A | 9/1989 |
| JP | 8-212532 A | 8/1996 |

OTHER PUBLICATIONS

Patent Abstracts of Japan, abstracting JP-A-1-232522 of Sep. 18, 1989.
Patent Abstracts of Japan, abstracting JP-A-8-212532 of Aug. 20, 1996.

* cited by examiner

*Primary Examiner*—Holly Rickman
(74) *Attorney, Agent, or Firm*—Sughrue Mion, PLLC

(57) ABSTRACT

The present invention relates to a magnetic recording medium, which has excellent magnetic characteristics. The present invention also relates to a method for producing a magnetic recording medium where a plurality of targets are repeatedly sputtered several times in sequential order to form non-magnetic and magnetic films on a substrate.

8 Claims, 4 Drawing Sheets

MAGNETIC RECORDING MEDIUM AND PRODUCTION PROCESS THEREOF

CROSS REFERENCE TO RELATED APPLICATIONS

This is a divisional of Application Ser. No. 09/715,166 filed Nov. 20, 2000 now abandoned, which claims benefit of Provisional Application Ser. No. 60/184,335 filed Feb. 23, 2000; the above noted prior applications are all hereby incorporated by reference.

FIELD OF THE INVENTION

The present invention relates to a magnetic recording medium such as a magnetic drum, a magnetic tape, or a magnetic disk, and to a method for producing the medium. Particularly, the present invention relates to a magnetic recording medium which has excellent magnetic characteristics such as noise characteristics and coercive force, and to a method for producing the medium.

BACKGROUND OF THE INVENTION

In recent years, as the recording density of magnetic disk apparatus has increased, many magnetic heads utilizing the magnetoresistance effect (hereinafter such a head will be abbreviated as "MR head") have been employed. In accordance with this trend, there is demand for a magnetic recording medium which has excellent magnetic characteristics, such as noise characteristics and coercive force.

This is because an MR head has high reproduction sensitivity and low head noise as compared with a conventional electromagnetic induction-type head, and thus a magnetic recording medium must have excellent magnetic characteristics, such as noise characteristics, in order to obtain enhanced characteristics of magnetic disk apparatus, such as S/N ratio and recording density.

At the present time, a generally-used magnetic recording medium comprises a substrate formed of an NiP-plated Al alloy, a non-magnetic undercoat film formed of Cr or a similar element which is formed on the substrate, and a magnetic film formed of a material predominantly comprising Co which is formed on the undercoat film.

A magnetic recording medium disclosed in Japanese Patent Publication (kokoku) No. 5-24564 is known as the aforementioned medium. The magnetic recording medium disclosed in this publication comprises a non-magnetic undercoat film which has a thickness of 50–200 Å and is formed of Cr, to thereby enhance squareness ratio.

Japanese Patent Application Laid-Open (kokai) No. 1-232522 discloses a magnetic recording medium which comprises a non-magnetic undercoat film comprising an alloy between Cr and one or more metals selected from among Cu, Nb, Ti, V, Zr, Mo, Zn, W, and Ta, the film having a thickness of 500–3000 Å, to thereby enhance magnetic characteristics, particularly coercive force.

However, in the magnetic recording medium disclosed in the aforementioned Japanese Patent Publication (kokoku) No.5-24564, the non-magnetic undercoat film formed of Cr is thin, and thus crystals of the material of the film grow insufficiently in the film. As a result, the magnetic film of the medium has poor crystal structure, thereby resulting in unsatisfactory magnetic characteristics, such as coercive force.

In the magnetic recording medium disclosed in Japanese Patent Application Laid-Open (kokai) No. 1-232522, a non-magnetic undercoat film formed of a Cr alloy is thick, and thus grains formed of a Cr alloy grow excessively in the film during film formation. As a result, when a magnetic film is formed on the non-magnetic undercoat film, the magnetic grains in the magnetic film increase in size and the grains grow epitaxially with respect to Cr alloy grains in the undercoat film. Therefore the magnetic recording medium provides poor noise characteristics.

A magnetic recording medium disclosed in Japanese Patent Application Laid-Open (kokai) No. 8-212532 has improved magnetic characteristics such as coercive force and noise characteristics. The magnetic recording medium disclosed in the publication comprises a magnetic layer of multi-layer structure in which many magnetic films and non-magnetic films are alternately stacked, and the magnetic film is formed of materials of high coercive force, such as a CoNiCrTa-type material, to thereby impart high coercive force and low noise to the medium.

Formation of a magnetic film or non-magnetic undercoat film in a magnetic recording medium is usually carried out by means of sputtering. Apparatus for carrying out sputtering are usually categorized into one of two modes, which are called a static counter film-formation mode and a motion counter film-formation mode.

A static counter film-formation mode refers to a mode in which, for example, a sputtering apparatus provided with a chamber comprising gate valves at either end of the chamber is employed; a target comprising a material for a film to be formed is placed in the chamber; a disk to be subjected to sputtering is conveyed into the chamber through a gate valve at one end of the chamber; the disk is halted at a position where the disk opposes the target; the disk is subjected to sputtering by use of the target in a static state; and after completion of sputtering, the disk is transferred to the other end of the chamber and removed from the chamber. In contrast, a motion counter film-formation mode refers to a mode in which a disk is subjected to sputtering in a chamber while the disk is conveyed from one end of the chamber to the other end without the disk being allowed to stop.

In each of these modes, a disk is subjected to sputtering while being conveyed in one direction, and carrying out film-formation twice or more times in one disk by use of a single target is not considered. Therefore, in order to form a layer comprising a plurality of films which are formed of the same material, as in the case of the aforementioned magnetic layer of multi-layer structure, another method; for example, one of the following three methods, must be carried out.

(1) After a film is formed on a disk in a first chamber by use of a target, the disk is transferred to a second chamber, and another film is formed on the disk by use of a target in the second chamber. Thereafter, the disk is transferred back to the first chamber, and the disk is again subjected to sputtering.

(2) After a disk is subjected to sputtering in a chamber, the disk is removed from the chamber and thereafter conveyed into the chamber again, to thereby again subject the disk to sputtering.

(3) A sputtering apparatus comprising a plurality of chambers comprising targets formed of the same material is employed, and a disk is conveyed into these chambers sequentially, thereby subjecting the disk to sputtering.

When the aforementioned methods (1) and (2) are carried out, productivity may decrease. Meanwhile, when the aforementioned method (3) is carried out, particularly, in order to form multiple films of the same material, a sputtering apparatus comprising chambers which match the number of the films must be employed, and thus the apparatus is required to be large in size, resulting in disadvantageously high production costs.

Generally, in order to form a magnetic film or non-magnetic film comprising a plurality of materials, the following methods, for example, are carried out.

(a) A film to be formed is subjected to sputtering by use of a target comprising an alloy of the same composition as the film.

(b) A portion of a plurality of materials for forming the aforementioned film is molded into chips and the chips are buried into another portion of the materials, or the materials are ground so as to obtain particles and the particles are mixed uniformly and aggregated, to thereby form a target of the composite material. The film is then formed through sputtering by use of this target.

(c) A plurality of targets which are formed of a portion of the aforementioned materials and differ from one another are prepared, and the targets are placed in one chamber of a sputtering apparatus. A film is formed through sputtering by simultaneous use of the targets; i.e., through co-sputtering.

However, when the above method (a) employing an alloy target is carried out, the mechanical strength of the target may be lowered, depending on the physical properties of the alloy, causing difficulty in production of a magnetic recording medium.

For example, in the case in which the material of a film to be formed comprises pure metals X and Y, which rarely form a solid solution region and are represented by a eutectic-type phase diagram, the pure metals X and Y coexist in the target in a small particle state when these metals are mixed to form a target, since these metals rarely form a solid solution. The bonding between particles comprising these pure metals X and Y is very weak, and thus the target has low mechanical strength and tends to break. Therefore, when such a target is employed, the target is easily broken during production thereof or sputtering, which may result in difficulty in production of a magnetic recording medium.

When the aforementioned materials differ significantly in specific gravity, a uniform target cannot be produced through a cast method usually employed, and thus a film of a desired composition may be difficult to form.

In the above method (b) employing a composite target comprising a plurality of materials, when the target is formed, impurities such as oxygen may enter interfaces between the materials. As a result, a film formed from the target will comprise large amounts of such impurities, and the magnetic recording medium produced may have poor magnetic characteristics such as coercive force and squareness ratio.

It has been reported that the magnetic characteristics of a magnetic recording medium, such as coercive force, can be enhanced by lowering the concentration of oxygen as an impurity in a film in the medium. For example, WO 95/03603 discloses such a phenomenon in a magnetic recording medium. Therefore, there is demand for a method for easily producing a magnetic recording medium of excellent magnetic characteristics, in which the concentration of the aforementioned impurities is lowered.

Particularly, when a target is employed in which a portion of a plurality of materials is molded into chips and the chips are buried into another portion of the materials, a film formed from the target exhibits non-uniformity in plane, and thus the magnetic recording medium produced may have poor magnetic characteristics.

In the above method (c) in which sputtering is carried out by simultaneous use of a plurality of targets, the targets must be placed in a single chamber. Therefore, in most cases, a portion of the targets must be set at a position which is unsuitable for forming a film that exhibits uniformity in a surface direction of a disk. Thus, a film formed from the targets may lack uniformity in plane, resulting in poor magnetic characteristics of the produced magnetic recording medium.

In view of the foregoing, an object of the present invention is to provide a magnetic recording medium which has excellent magnetic characteristics such as noise characteristics and coercive force, as well as a method for producing the medium efficiently and easily.

In addition, at present, further enhancement of the recording density of a magnetic disk apparatus or the like apparatus is a serious issue. Under the circumstances, there is demand for further enhancement of magnetic characteristics of a conventional recording medium.

In view of the foregoing, an object of the present invention is to provide a magnetic recording medium having excellent noise characteristic and excellent magnetic characteristics such as coercive force.

Furthermore, when the conventional method (1) is employed, tiny amounts of impurities such as oxygen and nitrogen remaining in a chamber are deposited on the surface of a disk during transfer of the disk from one chamber to another chamber. Thus, a film formed through sputtering comprises considerable amounts of impurities, and a recording medium fabricated from the film may have poor magnetic characteristics.

In the conventional method (2), impurities comprised in a chamber migrate into the aforementioned film during transfer of the disk.

Similarly, when the conventional method (3) is employed, migration of impurities may cause degradation of magnetic characteristics. In addition, forming a plurality of layers comprising the same material requires a sputtering apparatus including a plurality of chambers corresponding to the number of layers. Thus, a large-scale apparatus is required, thereby disadvantageously elevating production cost.

These three methods require a long period of time for forming a film, and the production cost disadvantageously increases. The cumbersome operations of these methods are also unsatisfactory.

Therefore, there is demand for a method for forming a magnetic film which provides excellent magnetic characteristics at high efficiency and with ease.

In view of the foregoing, an object of the present invention is to provide a magnetic recording medium having excellent magnetic characteristics, such as coercive force, and an excellent noise characteristic. Another object of the invention is to provide a method for producing the magnetic recording medium at high efficiency and with ease.

SUMMARY OF THE INVENTION

The above-described problems with respect to targets can be solved by a method for producing a magnetic recording medium which comprises a non-magnetic substrate, a non-magnetic undercoat film, a magnetic film, and a protective film, the films being successively formed on the substrate, by use of a sputtering apparatus comprising a plurality of targets, in which the method comprises repeatedly subjecting the non-magnetic undercoat film and/or the magnetic film to sputtering several times by sequential use of the targets, and at least two of the targets being formed of different materials.

The following is a specific example of the above-described method which may be carried out. A disk on which the non-magnetic undercoat film and/or the magnetic film are to be formed is held on a rotatable pallet, the pallet is sequentially set at positions opposite the targets during rotation of the pallet, and sputtering is repeatedly carried out several times by sequential use of the targets while the pallet is rotated several times, to thereby form the non-magnetic undercoat film and/or the magnetic film on the disk.

Magnetic characteristics of a magnetic recording medium are enhanced when the medium is produced through the above-described method. The reasons have not yet been elucidated, but such enhancement may relate to the phenomenon that, when the non-magnetic undercoat film and/or the magnetic film are formed through sputtering as described above, magnetic grains in the magnetic film become small and the interaction between the grains weakens.

Preferably, sputtering is carried out while the aforementioned pallets are rotated continuously.

A target which is employed in this method preferably comprises a portion of the materials of the non-magnetic undercoat film and/or the magnetic film, and the target is preferably formed of a single element.

The targets may be set at positions opposite both sides of the aforementioned disk, to thereby form the non-magnetic undercoat film and/or the magnetic film at both sides of the disk by use of the targets.

The magnetic recording medium of the present invention is characterized in that a non-magnetic undercoat film and/or a magnetic film is produced by carrying out sputtering repeatedly by sequential use of targets, at least two of the targets being formed of different materials.

The aforementioned problems of recording density of a magnetic disk apparatus or the like can be solved by a magnetic recording medium comprising a magnetic film, which has a structure in which a number of magnetic grains are separated from one another by a grain boundary phase comprising the same constitutional element that constitutes the magnetic grains and the intergrain distance in the grain boundary phase is 10 Å or more.

Preferably, the magnetic film comprises Co and Cr, and the ratio of the Cr concentration of the grain boundary phase ($c_2$) to that of the magnetic grains ($c_1$), represented by $c_2/c_1$, is adjusted to 1.4 or higher.

Preferably, the Cr concentration ($c_2$) is 15 at % or higher.

Preferably, Ta is incorporated into the magnetic film at a concentration of 2–8 at %.

Preferably, the magnetic film has a thickness of 150–350 Å.

Preferably, the magnetic grains have a grain size of 60–200 Å.

Alternatively, a magnetic recording medium of the present invention comprises a magnetic film, wherein the magnetic film comprises Co and Cr and has a structure in which a number of magnetic grains are separated from one another by a grain boundary phase comprising the same constitutional element that constitutes the magnetic grains and the ratio of the Cr concentration of the grain boundary phase ($c_2$) to that of the magnetic grains ($c_1$), represented by $c_2/c_1$, is adjusted to 1.4 or higher.

The present invention provides a method for producing, by use of a sputtering apparatus provided with a plurality of targets, a magnetic recording medium comprising a disk formed of a non-magnetic substrate coated with a non-magnetic undercoat film and a magnetic film and a protective film formed on the disk, characterized in that the plurality of targets comprise at least one magnetic target formed of a magnetic material and the remaining targets comprise at least one non-magnetic target formed of a non-magnetic material. The disk is held on a rotatable pallet; the pallet is set at a position such that the disk sequentially opposes a magnetic target and a non-magnetic target; a magnetic film which comprises a magnetic unit layer formed of a magnetic material and a non-magnetic unit layer formed of a non-magnetic material superposed one on another is formed through repeated sputtering by sequential use of a magnetic target and a non-magnetic target while the pallet is rotated; and the target employed initially for forming the magnetic film is a magnetic target.

Alternatively, at least one non-magnetic target may be formed of a material predominantly comprising Cr, and the target employed initially for forming a magnetic film may be a non-magnetic target formed of a material predominantly comprising Cr rather than a magnetic target.

Preferably, the target finally employed for forming a magnetic film is a magnetic target.

Preferably, the magnetic film is formed on the disk through repeated sputtering three times or more by use of a magnetic target and a non-magnetic target while the pallet is rotated.

The present invention provides a magnetic recording medium employing a magnetic film having a multi-layer structure in which magnetic unit layers formed of a magnetic material and non-magnetic layers formed of a non-magnetic material are alternately stacked and the innermost layer is a magnetic unit layer.

The present invention also provides a magnetic recording medium comprising a magnetic film of multi-layer structure in which magnetic unit layers formed of a magnetic material and non-magnetic layers formed of a non-magnetic material predominantly comprising Cr are alternately stacked and the innermost layer is the non-magnetic unit layer formed of a non-magnetic material predominantly comprising Cr.

The magnetic film having a magnetic unit layer as the outermost layer is preferred, in that record-reproducing output of a fabricated magnetic recording medium is enhanced.

The present invention further provides a method for producing a magnetic recording medium by use of a sputtering apparatus provided with a plurality of targets, the medium comprising a non-magnetic substrate, a non-magnetic undercoat film, a magnetic film, and a protective film, characterized in that at least two of the targets are formed of different materials and at least one of the targets comprises Cr as a primary component. The non-magnetic substrate is held in a rotatable pallet and the pallet is set at a position so as to cause the non-magnetic substrate to sequentially oppose the targets during rotation of the pallet; sputtering is repeatedly carried out by sequential use of the targets while the pallet is rotated, to thereby form on the non-magnetic substrate a non-magnetic undercoat film in which the materials of the targets are alloyed; and the target employed initially for forming the non-magnetic undercoat film is formed of a material comprising Cr as a primary component.

Preferably, the target employed finally is formed of a material comprising Cr as a primary component during formation of the non-magnetic undercoat film.

The present invention also provides a method for producing a magnetic recording medium by use of a sputtering apparatus provided with a plurality of targets, the medium comprising a disk in which a non-magnetic undercoat film is formed on a non-magnetic substrate, a magnetic film, and a protective film, the films being successively formed on the disk, wherein at least two of the targets are formed of different materials and at least one of the targets comprises Co as a primary component. The disk is held in a rotatable pallet and the pallet is set at a position so as to cause the disk to sequentially oppose the targets during rotation of the pallet; sputtering is repeatedly carried out by sequential use of the targets while the pallet is rotated, to thereby form a magnetic film on the disk in which the materials of the targets are alloyed; and the target employed initially is formed of a material comprising Co as a primary component.

At least one of the targets may be formed of a material comprising Cr as a primary component, and the target employed initially during formation of the magnetic film may be a target formed of a material comprising Cr as a primary component, instead of that comprising Co as a primary component.

BRIEF DESCRIPTION OF THE DRAWINGS

FIG. 2(A) is a front view, and FIG. 2(B) is a cross-sectional view.

FIG. 3(A) is a front view, and FIG. 3(B) is a cross-sectional view.

FIG. 4(A) is a front view, and FIG. 4(B) is a cross-sectional view.

FIG. 5(A) is a front view, and FIG. 5(B) is a cross-sectional view.

DESCRIPTION OF THE PREFERRED EMBODIMENTS

Figure 1:
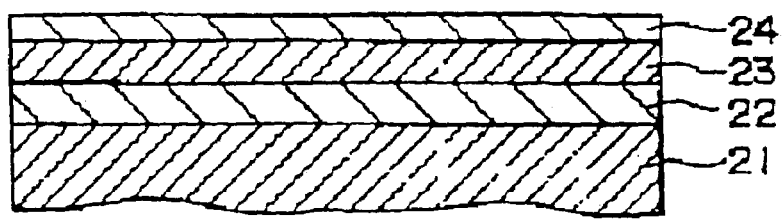
FIG. 1 is a partial cross-sectional view showing an embodiment of the magnetic recording medium of the present invention.

A first embodiment of the present invention is described below. FIG. 1 is a schematic representation showing an embodiment of the magnetic recording medium of the present invention. As shown in FIG. 1, the medium comprises a non-magnetic substrate 21, a non-magnetic undercoat film 22, a magnetic film 23, and a protective film 24, such that the films are sequentially formed on the substrate.

The substrate 21 may be formed of an Al alloy on which is formed an NiP-plated film, which is generally used as a substrate for a magnetic recording medium, or of material such as glass, ceramic, carbon, silicon, or silicon carbide.

The substrate 21 may be subjected to texturing, such as mechanical surface texturing.

The non-magnetic undercoat film 22 may be formed of a single layer, or of multiple layers in which a plurality of unit layers are stacked alternately.

The material of the non-magnetic undercoat film 22 may be one metal from among Cr, Pt, Ta, Ni, Ti, Ag, Cu, Al, Au, W, Mo, Nb, V, Zr, Co, and Zn, or an alloy of two or more of these metals. Specific examples of preferred materials for the film include a material comprising as a primary component an alloy of Cr, Cr/Ti, Cr/V, Cr/Si, Cr/Ag/Ta, or Cr/W.

As used herein, the term "primary component" refers to a component which is comprised in an amount of 50 at % or more.

When the non-magnetic undercoat film 22 is formed of multiple layers film. Specific examples of the film 22 include a film formed of multiple layers in which three types of unit films, each unit film being formed of Cr, Ag, or Ta, are stacked alternately, for example, three times or more; and a film formed of multiple layers in which two types of unit films, each unit film being formed of Cr or Ti, are stacked alternately.

The aforementioned unit film is preferably formed so as to have a mean thickness of 50 Å or less.

The number of the unit films in the non-magnetic undercoat film 22 is appropriately determined in consideration of magnetic characteristics of the produced magnetic recording medium. The proportion of the thicknesses of the unit films may be appropriately determined in consideration of magnetic characteristics of the produced magnetic recording medium.

The overall thickness of the non-magnetic undercoat film 22 is preferably 50–600 Å.

The magnetic film 23 may be formed of a single layer, or of multiple layers in which a plurality of unit layers are stacked alternately.

The material of the magnetic film 23 may comprise a magnetic element including a 3d transition element such as Co, Fe, or Ni, or a 4f transition element. Of these, a material comprising Co, which has high anisotropic energy and forms an hcp structure, is particularly preferable since coercive force can be enhanced.

No particular limitation is imposed on the type of the magnetic film 23, so long as it comprises the aforementioned magnetic element. For example, the film 23 may be formed of the aforementioned magnetic element, and of one metal selected from among Cr, Pt, Ta, B, Ti, Ag, Cu, Al, Au, W, and Mo or an alloy of two or more of these metals. Specific examples of preferred materials for the film include a material comprising as a primary component an alloy of Co/Cr, Co/Cr/Ta, Co/Cr/Pt/Ta, Co/Ni, Co/Ni/Pt, Co/Ni/Cr, or Co/Ni/Cr/Pt.

When the magnetic film 23 is formed of multiple layers, specific examples of the film 23 include a film formed of multiple layers in which four types of unit films, each unit film being formed of Co, Cr, Pt, or Ta, are stacked alternately, for example, three times or more; and a film formed of multiple layers in which two types of unit films, each unit film being formed of Cr or a Co/Cr/Ta alloy, are stacked alternately, for example, three times or more.

The aforementioned unit film is formed so as to have a mean thickness of 50 Å or less, preferably 1–50 Å.

The number of the unit films in the magnetic film 23 is appropriately determined in consideration of the magnetic characteristics of the produced magnetic recording medium. The proportion of the thicknesses of the unit films may be appropriately determined in consideration of magnetic characteristics of the produced magnetic recording medium.

The overall thickness of the magnetic film 23 is preferably 100–300 Å.

At least one of the aforementioned non-magnetic undercoat film 22 and magnetic film 23 comprises a plurality of materials.

The protective film 24 may be formed of material such as carbon, silicon oxide, or silicon nitride, and the thickness of the film is preferably 50–200 Å.

A lubrication film formed of perfluoropolyether or a similar material may be provided on the protective film 24.

A method for producing the above-described magnetic recording medium will next be described.

FIGS. 2(A) through 5(B) are schematic representations showing main portions of a production apparatus employed for carrying out an embodiment of a group method for producing a magnetic recording medium of the present invention. The production apparatus shown in the figures is a sputtering apparatus. In the figures, reference numeral 1 represents a chamber, reference numeral 2 represents a target, reference numeral 3 represents a motor for rotating a pallet, reference numeral 4 represents a conveying rail, reference numeral 5 represents a cryopump, reference numeral 6a represents a first gate valve, reference numeral 6b represents a second gate valve, reference numeral 7 represents a carrier, reference numeral 8 represents a conveying gear, reference numeral 10 represents a pallet, and reference numeral 11 represents a pallet clamp.

Reference numerals 9A, 9B, 9C, and 9D represent disks which are subjected to film-formation by use of the apparatus.

The chamber 1 comprises the cryopump 5 which is used for evacuating the chamber 1, and first and second gate valves 6a and 6b at the respective ends of the chamber, which valves can be opened and closed. The motor 3 for rotating the pallet 10 which is conveyed into the chamber 1 in a circumferential direction is provided at the centers of both side walls of the chamber 1, and the motor comprises a shaft 3a. The shaft 3a is provided so as to move back and forth in a direction to the pallet 10 and to cause the head of the shaft to be engaged with the pallet clamp 11 of the pallet 10 when the shaft moves forward.

The target 2 comprises four types of targets; i.e., a first target through a fourth target 2A, 2B, 2C, and 2D, which are provided on both inner side walls of the chamber. In the apparatus shown in the figures, the first target through the fourth target 2A, 2B, 2C, and 2D are formed of materials A, B, C, and D, respectively.

The target materials A to D may be a portion of materials for forming a film to be formed on the disk. Particularly when a single element is employed as the material, the concentration of impurities in the formed film can be lowered, which is preferable.

Of the materials A to D, at least two materials are different. When a film which is formed by use of the apparatus is a non-magnetic undercoat film, each of the materials may be one metal selected from among Cr, Pt, Ta, Ni, Ti, Ag, Cu, Al, Au, W, Mo, Nb, V, Zr, Co, and Zn, or an alloy comprising two or more of these metals. Specifically, the materials A and C may be Cr, and the materials B and D may be Ti.

When a film to be formed is specifically a magnetic film, each of the materials A to D may be one metal selected from among Co, Fe, Ni, B, Pt, Ta, Cr, Ti, Ag, Cu, Al, Au, W, and Mo, or an alloy comprising two or more of these metals. For example, the materials A, B, C, and D may be Co, Cr, Pt, and Ta, respectively. Alternatively, the materials A and C may be Cr, and the materials B and D may be a Co/Cr/Ta alloy.

At the bottom portion inside the chamber 1, the conveying rail 4 is provided in order to convey the carrier 7 into and from the chamber 1.

The carrier 7 is provided in order to convey the pallet 10, and comprises two shielding plates 7a on the conveying gear 8, so as to be parallel with each other and to have a predetermined space between them. The carrier is provided so as to move on the conveying rail 4 in the chamber 1.

The shielding plate 7a comprises openings 7b at positions opposite the targets 2A to 2D when the carrier 7 is set in the chamber 1. The openings 7b are formed so as to have a diameter which is larger than that of each of the disks 9A to 9D. At the center of the shielding plate 7a, a penetration hole 7c is provided in order to accommodate the shaft 3a of the motor 3 for rotating the pallet.

The pallet 10 is a disk which can rotate in a circumferential direction. Openings 10a which serve as disk-holding portions are provided along a circumferential direction of the pallet 10, and the openings are equal in number to the targets 2. The pallet clamp 11 is provided at the center of the pallet 10 and is engaged with the head of the shaft 3a of the motor 3 for rotating the pallet 10.

The openings 10a are provided on the pallet 10 at positions so that the disks are held in the openings 10a opposite the targets 2A to 2D when the pallet 10 is rotated while the carrier 7 is set in the chamber 1.

An embodiment of a method for producing the magnetic recording medium of the present invention will next be described by taking as an example the case in which the first to the fourth disks 9A to 9D are repeatedly subjected to sputtering by use of the aforementioned materials A to D sequentially, to thereby form films on the surfaces of the disks.

Firstly, each of the first to the fourth disks 9A to 9D is held in a respective opening 10a of the pallet 10, so as to be parallel with the pallet 10.

When a film to be formed by use of the apparatus is a non-magnetic undercoat film, each of the first to the fourth disks 9A to 9D which are employed herein may be a substrate formed of an NiP-plated Al alloy or glass. When a film to be formed is a magnetic film, the disks may comprise the aforementioned substrate and a non-magnetic undercoat film formed thereon through a conventional sputtering method by use of an alloy of Cr or Cr/Ti.

Subsequently, the pallet 10 holding the first to the fourth disks 9A to 9D is set between the two shielding plates 7a of the carrier 7. Thereafter, the first gate valve 6a of the chamber 1 is opened, the carrier 7 is conveyed into the chamber 1 along the conveying rail 4, and the carrier 7 is set in the chamber such that each of the openings 7b of the shielding plates 7a opposes the corresponding target 2. Subsequently, the head of the shaft 3a of the motor 3 for rotating the pallet in the chamber 1 is engaged with the pallet clamp 11 of the pallet 10.

After the carrier 7 is conveyed into the chamber 1 as described above, the first gate valve 6a is closed, the chamber 1 is evacuated to approximately $1\times10^{-7}$ to $1\times10^{-6}$ Torr by use of the cryopump 5, and sputtering gas such as Ar gas is introduced into the chamber 1.

In this case, the pallet 10 is set in the chamber such that the first to the fourth disks 9A, 9B, 9C, and 9D oppose the first to the fourth targets 2A, 2B, 2C, and 2D, respectively (the above-described process will hereinafter be called "Process 1").

Subsequently, the pallet 10 is rotated continuously in the direction of the arrows shown in FIG. 2 at a rate of, for example, 30–120 rpm. In this process, sputtering is carried out by use of the targets 2A to 2D as described below.

By use of the first target 2A formed of material A, the material A is supplied to both sides of the first disk 9A through the openings 7b (Process 2).

Figure 2A:
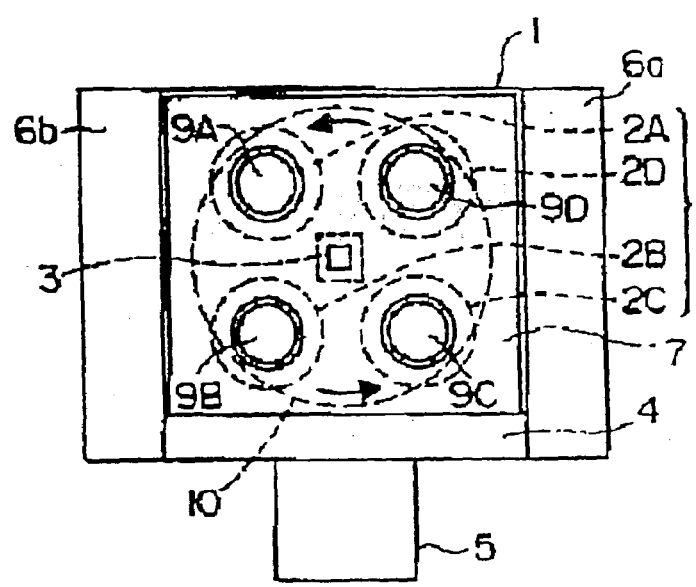
FIGS. 2(A) and 2(B) are schematic representations showing a main portion of a production apparatus employed for carrying out an example of the method for producing a magnetic recording medium of the present invention.
Figure 2B:
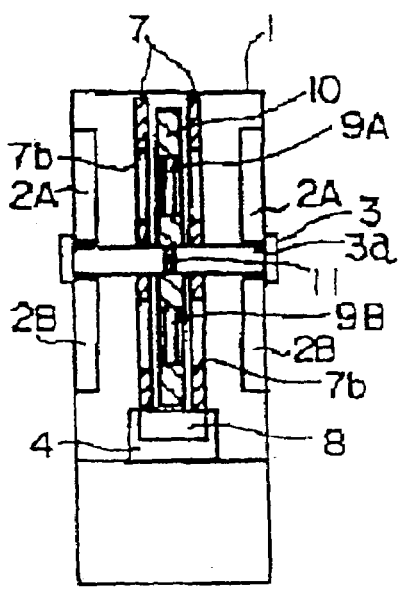
Figure 3A:
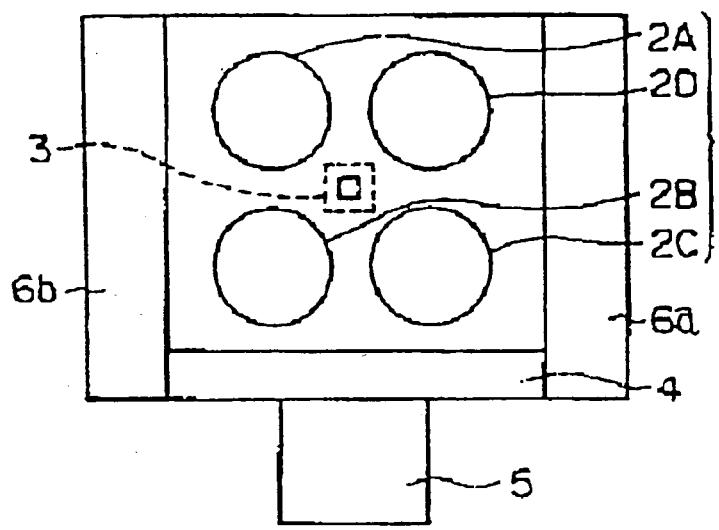
FIGS. 3(A) and 3(B) are schematic representations showing a chamber of the production apparatus shown in FIGS. 2(A)–2(B).
Figure 3B:
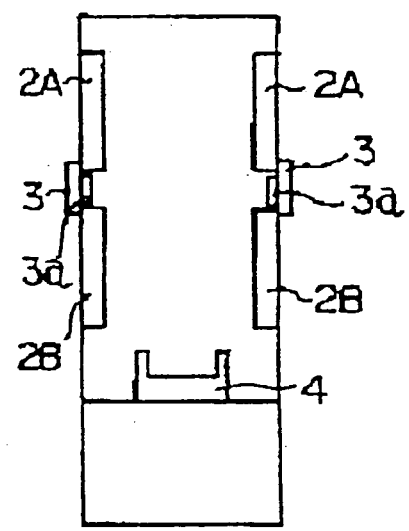
Figure 4A:
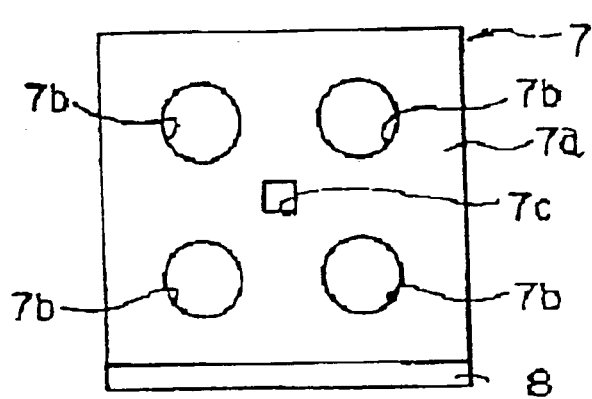
FIGS. 4(A) and 4(B) are schematic representations showing a carrier of the production apparatus shown in FIGS. 2(A)–2(B).
Figure 4B:
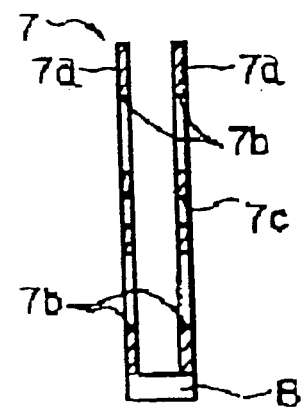
Figure 5A:
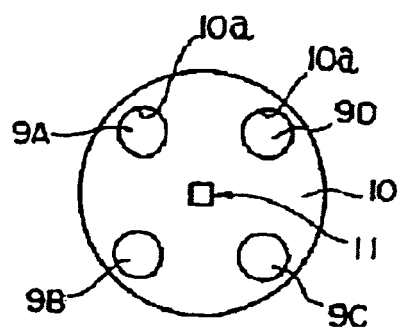
FIGS. 5(A) and 5(B) are schematic representations showing a pallet of the production apparatus shown in FIGS. 2(A)–2(B).
Figure 5B:
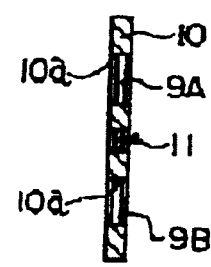

Next, the pallet 10 is rotated in the direction of the arrows shown in FIG. 2 by approximately 90°. When the first and fourth disks 9A and 9D are set at positions opposite the second target 2B and the first target 2A, respectively, the disks 9A and 9D are subjected to sputtering by use of the targets 2B and 2A, respectively, and thus the material B is supplied to the first disk 9A and the material A is supplied to the fourth disk 9D (Process 3).

Subsequently, the pallet 10 is further rotated by approximately 90°. When the first, the fourth, and the third disks 9A, 9D, and 9C are set at positions opposite the targets 2C, 2B, and 2A, respectively, the materials C, B, and A are supplied to the first, the fourth, and the third disks 9A, 9D, and 9C, respectively (Process 4).

Subsequently, the pallet 10 is further rotated by approximately 90°, and the materials D, C, B, and A are supplied to the first, the fourth, the third, and the second disks 9A, 9D, 9C, and 9B, respectively (Process 5–1).

Then, the pallet 10 is further rotated by approximately 90°, and the materials A, D, C, and B are supplied to the first, the fourth, the third, and the second disks 9A, 9D, 9C, and 9B, respectively (Process 5–2).

Subsequently, the pallet 10 is further rotated by approximately 90°, and the materials B, A, D, and C are supplied to the first, the fourth, the third, and the second disks 9A, 9D, 9C, and 9B, respectively (Process 5–3).

Then, the pallet 10 is further rotated by approximately 90°, and the materials C, B, A, and D are supplied to the first, the fourth, the third, and the second disks 9A, 9D, 9C, and 9B, respectively (Process 5–4).

These processes 5–1 to 5–4 are repeated a predetermined number of times; for example, twice or more.

Subsequently, the pallet 10 is further rotated by approximately 90°, and the materials D, C, B, and A are supplied to the first, the fourth, the third, and the second disks 9A, 9D, 9C, and 9B, respectively (Process 6).

Then, the pallet 10 is further rotated by approximately 90°, and the materials D, C, and B are supplied to the fourth, the third, and the second disks 9D, 9C, and 9B, respectively (Process 7).

After that, the pallet 10 is further rotated by approximately 90°, and the materials D and C are supplied to the third and the second disks 9C and 9B, respectively (Process 8).

Next, the pallet 10 is further rotated by approximately 90°, and the material D is supplied to the second disk 9B (Process 9).

In the above-described processes, the thickness of a film to be formed or the supply amount of the materials A to D can be adjusted to a desired value by means of appropriately regulating the time for carrying out these processes or the amount of electric power which is supplied to the targets 2A to 2D.

In these processes 1 to 9, the relative positions of the disks 9A to 9D and the targets 2A to 2D which are set so as to oppose the disks are almost constant.

In the above-described Processes 1 to 9, the materials A to D are repeatedly sputtered to the first to the fourth disks 9A to 9D many times; for example, three times or more, sequentially.

In the above-described processes 2 to 9, the materials A to D supplied to each of the disks 9A to 9D form a multi-layer film comprising many unit films, each unit film being formed of each of the materials, and the unit films are stacked on the disk sequentially such as unit film A/unit film B/unit film C/unit film D/unit film A/unit film B/unit film C/unit film D . . . unit film A/unit film B/unit film C/unit film D, in accordance with sputtering conditions such as the amounts of the supplied materials and the temperature of the disk. Alternatively, in accordance with the sputtering conditions, the materials A to D diffuse and mix on each of the disks 9A to 9D, to thereby form a mixed film (single layer) comprising an alloy of the materials A to D.

When a film to be formed through the above-described processes is the magnetic film 23, the materials A to D may diffuse, to thereby form magnetic grains.

After completion of the above-described Process 9, the shaft 3a of the motor 3 for rotating the pallet is removed from the pallet clamp 11 of the pallet 10, the second gate valve 6b is opened, and the carrier 7 is conveyed from the chamber 1 (Process 10).

As described above, sputtering is carried out repeatedly by use of the targets 2A to 2D formed of the materials A to D sequentially, to thereby form the non-magnetic undercoat film 22 and/or the magnetic film 23 on the disks 9A to 9D.

When a film to be formed through the above-described processes is the non-magnetic undercoat film 22, the magnetic film 23 and the protective film 24 are subsequently formed through a conventional sputtering method or the above-described Processes 1 to 10. Meanwhile, when a film to be formed through the above-described processes is the magnetic film 23, the protective film 24 is subsequently formed through a conventional sputtering method.

In the above-described method for producing the magnetic recording medium, the non-magnetic undercoat film 22 and/or the magnetic film 23 comprising the materials A to D are formed by carrying out sputtering repeatedly by use of the targets 2A to 2D sequentially, each target being formed of each of the materials A to D. Therefore, magnetic characteristics, such as noise characteristics and coercive force, of the produced magnetic recording medium can be enhanced as compared with the case in which an alloy or complex of the materials is employed as a target.

A target employed in this method comprises a portion of materials of a film to be formed. Thus, even when an alloy having the same composition as the film has low mechanical strength, the targets 2A to 2D have sufficient strength, and accidents such as breakage of the targets can be prevented, to thereby enable efficient production of a magnetic recording medium.

In this method, the amount of impurities in a film to be formed can be lowered as compared with the case in which there is employed a composite target formed of a composite comprising the above-described materials, since such target tends to comprise large amounts of impurities.

Therefore, in this method, a magnetic recording medium which has excellent magnetic characteristics and comprises low amounts of impurities can be produced easily and efficiently.

In addition, in this method, a film to be formed comprises a plurality of materials which differ from one another in specific gravity. Therefore, even when a uniform target comprising an alloy of the materials is difficult to form, a uniform film can be formed by use of the materials.

Through Processes 1 to 9 in the above-described embodiment, sputtering can be carried out while the relative positions of the disks 9A to 9D and the targets 2A to 2D, which are set opposite the disks can be maintained almost constant. Therefore, sputtering can be carried out by always setting the target at a position which is suitable for forming a uniform film, as compared with a method in which sputtering is carried out by simultaneous use of a plurality of targets. As a result, a film to be formed exhibits uniformity in a surface direction, and the produced magnetic recording medium may have excellent magnetic characteristics.

Each of the above-described targets employed in this method is formed of a material comprising a single element comprising small amounts of impurities, and thus the amount of impurities in the above-described film formed by used of the targets can be lowered.

The above-described film is formed by carrying out repeated sputtering of the targets 2A to 2D sequentially, and the targets are set in a single chamber; i.e., in the chamber 1. Therefore, productivity of a magnetic recording medium is not lowered, and an apparatus for producing the medium is not required to be large in size.

Furthermore, the composition of a film to be formed can be varied by means of simple operation; for example, by appropriately regulating operative conditions during sputtering, such as the amount of electric power supplied to the targets 2A to 2D. Therefore, in this method, many types of films can be formed by use of a few targets, as compared with the case employing a target comprising the same composition as that of a film to be formed. As a result, a magnetic recording medium can be produced with ease, thereby enhancing productivity of the medium and reduce production cost.

Moreover, sputtering is carried out while the pallet 10 is rotated continuously, and thus sputtering can be carried out with ease, thereby enhancing productivity.

The production method of the above-described embodiment is an example for explaining the present invention specifically, and the invention is not limited to the above-described method. Therefore, when films are formed on the first to the fourth disks 9A to 9D, a material other than the material A may be chosen for initial sputtering and a material other than the material D may be chosen for final sputtering.

The sequence of the above-described materials A to D during sputtering may be chosen arbitrarily; for example, the sequence A/C/B/D . . . or B/D/C/B/A/ . . . can be used instead of the above-described sequence A/B/C/D . . . . In order to change the sequence of the materials employed in the above-described embodiment, the positions of the targets 2A to 2D in the chamber 1 may be determined in accordance with the sequence of the materials during sputtering.

The arrangement of the disks 9A to 9D in the chamber 1 is not limited to that shown in the above-described embodiment. In addition, the number of targets in the chamber 1 or of disks held on the pallet 10 is not limited to that shown in the embodiment, and the number thereof may be arbitrarily determined in accordance with the composition of a film to be formed. A plurality of targets which are employed in the present invention may comprise targets formed of the same material, so long as at least two of the targets are formed of different materials.

In the production method of the above-described embodiment, sputtering is carried out by continuously rotating the pallet 10 and setting the disks 9A to 9D at the positions opposite the targets 2A to 2D. However, the production method of the present invention is not limited to the above method, and a film may be formed by rotating the pallet 10 in an intermittent manner.

When disks are moved continuously or intermittently, in accordance with the positions of the disks in the chamber, electric power may be intermittently supplied to targets for carrying out intermittent discharge, or discharge may be continuously carried out, to thereby form a film.

A second embodiment of the present invention is described below.

Figure 6:
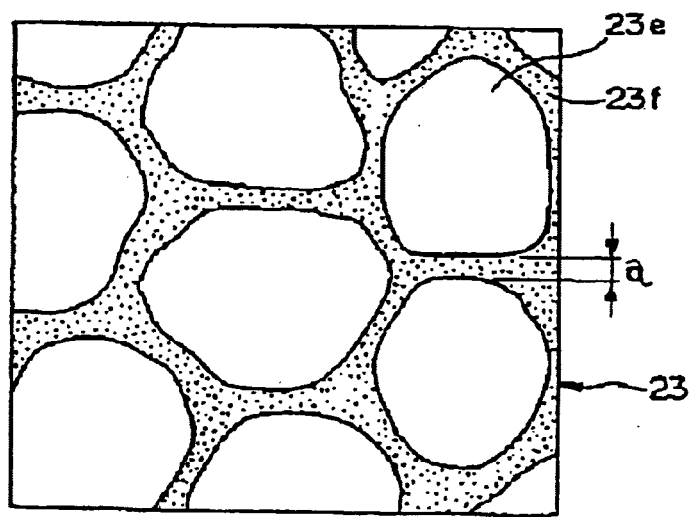
FIG. 6 is an example plane view showing a microscopic structure of a magnetic film of the magnetic recording medium shown in FIG. 1.

FIGS. 1 and 6 show an embodiment of a magnetic recording medium of the present invention. A recording medium shown in these figures comprises a non-magnetic substrate 21, a non-magnetic undercoat film 22, a magnetic film 23, and a protective film 24, in which the films are sequentially formed on the substrate.

Particularly, a non-magnetic undercoat 22 formed of a material comprising Cr is preferred in that a magnetic film 23, which is epitaxially grown on the undercoat film, has a favorable crystal structure.

The non-magnetic undercoat film 22 preferably has a thickness of 50–600 Å.

The magnetic film 23 preferably comprises magnetic elements such as Co at a concentration (average) of 70–90 at %.

The magnetic film 23 may be formed of a material such as an alloy. Particularly, a Cr-comprising alloy is preferred in that Cr forms crystals having an hcp structure with Co within a wide compositional range and the crystals tend to be segregated in the below-mentioned grain boundary phase.

The magnetic film 23 may comprise Cr at a concentration (average) of 14–20 at %.

When the magnetic film 23 formed of the above material further comprises Ta, Cr is easily segregated in the grain boundary phase. Such a grain boundary phase is difficult to magnetize and advantageously has an enhanced noise characteristic. When the Ta concentration (average concentration) of the magnetic film 23 is considerably low, an effect for promoting segregation of Cr decreases, whereas when the concentration is excessively high, the crystal structure of the magnetic film becomes disordered, thereby lowering coercive force of the magnetic film 23. Thus, the aforementioned Ta concentration is preferably 2–8 at %.

The magnetic film 23 preferably has an overall thickness of 100–300 Å. When the thickness is less than 100 Å, the crystal structure of the magnetic film is disordered, thereby lowering coercive force or a similar magnetic property, whereas when the thickness is in excess of 300 Å, the grain size of magnetic grains increases, thereby degrading a noise characteristic.

As shown in FIG. 6, in a recording medium, a portion of the aforementioned magnetic film 23, which portion consists essentially of a magnetic element, comprises a number of magnetic grains 23e, and these grains 23e are isolated from another by a grain boundary phase 23f.

The magnetic grains 23e are formed of a material for constituting the aforementioned magnetic film; e.g., a Co/Cr/Pt/Ta alloy, and preferably have an average grain size of 60–200 Å. An average grain size less than 60 Å results in a predominant magnetic aftereffect, whereas a grain size in excess of 200 Å disadvantageously degrades a noise characteristic.

The Cr concentration in the magnetic grains 23e represented by $c_1$ may be 8–15 at %.

The grain boundary phase 23f is formed of a material for constituting the aforementioned magnetic grains 23e; e.g., a Co/Cr/Pt/Ta alloy. However, the composition differs from that of magnetic grains 23e; i.e., the Cr concentration represented by $c_2$ is higher than the Cr concentration of magnetic grains 23e represented by $c_1$.

The ratio of the Cr concentration of the grain boundary phase 23f represented by $c_2$ to that of magnetic grains 23e represented by $c_1$; i.e., $c_2/c_1$, is 1.4 or more, preferably 1.4–3.0. The criteria of the limitation will be described. When the ratio is less than 1.4, the magnetic element concentration of the grain boundary phase 23f increases, thereby exhibiting an easy magnetization property of the grain boundary phase 23f. Therefore, exchange interaction between magnetic grains 23e is reinforced, thereby possibly degrading a noise characteristic.

The Cr concentration of the grain boundary phase 23f represented by $c_2$ is preferably 15 at % or higher.

When the Cr concentration $c_2$ is less than 15 at %, exchange interaction between magnetic grains is reinforced, thereby possibly degrading a noise characteristic.

The intergrain distance in the grain boundary phase 23f; i.e., "a" shown in FIG. 6, is 10 Å or more. The intergrain distance herein refers to the average intergrain distance.

When the distance "a" is less than 10 Å, the distance between magnetic grains 23e decreases, thereby reinforcing exchange interaction between these grains and possibly degrade a noise characteristic.

A method for producing the aforementioned magnetic recording medium will next be described.

Each of FIGS. 2(A) to 5(B) shows a predominant portion of an apparatus for producing a magnetic recording medium of the aforementioned embodiment.

An example method for producing a magnetic recording medium of the aforementioned embodiment employing the aforementioned apparatus will next be described.

The sputtering Processes 1 to 9 described above with respect to the first embodiment are repeated, thereby form a film comprising materials A to D on each of first to fourth disks (9A to 9D). In this embodiment, Co, Cr, Pt, and Ta are employed as materials A to D, respectively.

During carrying out the aforementioned Processes 2 to 9, materials A to D; i.e., Co, Cr, Pt, and Ta, supplied on disks A to D diffuse on the disks 9A to 9D, to thereby form magnetic grains 23e comprising an alloy comprising Co, Cr, Pt, and Ta and the grain boundary phase 23f. In this case, Cr included in the above materials segregates in the grain boundary phase 23f, and the Cr concentration of the grain boundary phase 23f represented by $c_2$ is higher than that of magnetic grains 23e represented by $c_1$.

In the above operation, since the aforementioned four materials are independently supplied onto disks 9A to 9D, Cr diffuses without interference by any other element and easily moves into the grain boundary phase. Thus, formation of the grain boundary phase 23f and segregation of Cr into the grain boundary phase 23f are promoted.

As described above, the magnetic film 23 comprising a Co/Cr/Pt/Ta alloy is formed on each of the disks 9A to 9D through repeated sputtering of materials A to D; i.e., targets 2A to 2D, each comprising Co, Cr, Pt, or Ta. The magnetic film 23 has a structure in which a number of magnetic grains 23e are separated from one another by the grain boundary phase 23f as shown in FIG. 6 and the intergrain distance in the grain boundary phase 23f is 10 Å or more.

On the thus-formed magnetic film 23, a protective film 24 comprising a material such as carbon is formed through a method such as customarily-employed sputtering, to thereby obtain a magnetic recording medium of the aforementioned embodiment.

In the above magnetic recording medium, since the intergrain distance in the grain boundary phase 23f is 10 Å or more, sufficient distance between magnetic grains 23e can be maintained, thereby suppressing exchange interaction between the particles. Thus, noise attributed to magnetic grains can be suppressed to a low level, thereby improving a noise characteristic.

In addition, since the grain boundary phase 23f comprises a constitutional element which constitutes magnetic grains 23e, the crystal structure of the grain boundary phase 23f and that of magnetic grains 23e are almost identical with each other. Thus, the magnetic film 23 has a uniform structure, and magnetic properties such as coercive force can be enhanced.

As described above, Cr is a non-magnetic element which alloys with Co and forms crystals having an hcp structure within a wide compositional range.

In addition to the above, when the ratio of the Cr concentration of the grain boundary phase 23f represented by $c_2$ to that of magnetic grains 23e represented by $c_1$; i.e., $c_2/c_1$, is adjusted to 1.4 or more, the magnetic element concentration of the grain boundary phase 23f is maintained at a low level, thereby making magnetization of the grain boundary phase 23f difficult without disordering the crystal structure of the grain boundary phase 23f.

Therefore, exchange interaction between magnetic grains 23e is suppressed, and a noise characteristic can be enhanced without lowering coercive force.

Furthermore, when the magnetic film 23 comprises Ta, Cr easily segregates in the grain boundary phase, magnetization of the grain boundary phase is made difficult. Thus, the aforementioned exchange interaction can be suppressed to a low level and a noise characteristic can be further enhanced.

A third embodiment of the invention is described-below.

Figure 7:
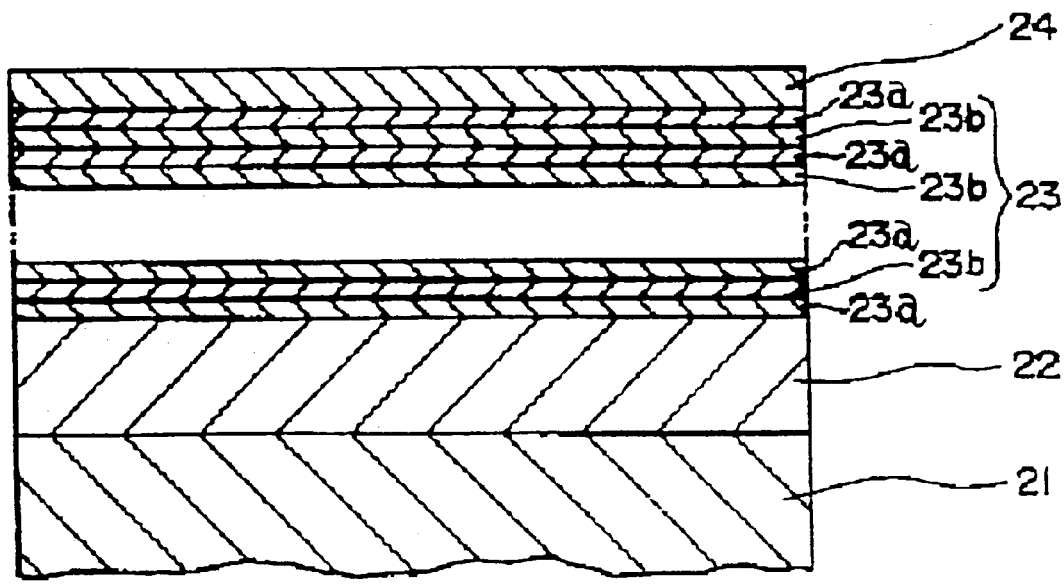
FIG. 7 is a partial cross-sectional view showing another embodiment of the magnetic recording medium of the present invention.

FIG. 7 shows an embodiment of a magnetic recording medium of the present invention. The recording medium shown in FIG. 7 comprises a non-magnetic substrate 21, a non-magnetic undercoat film 22, a magnetic film 23, and a protective film 24, in which the films are successively formed on the substrate.

In the magnetic recording medium of the present embodiment, the magnetic film 23 comprises magnetic unit layers 23a and non-magnetic unit layers 23b stacked several times, and the innermost layer is a magnetic unit layer 23a. Preferably, the magnetic layer 23 also has a magnetic unit layer 23a as the outermost layer.

The method for producing the aforementioned magnetic recording medium will next be described.

Each of FIGS. 2(A) to 5(B) shows a predominant portion of an apparatus for producing a magnetic recording medium of the aforementioned embodiment.

Targets 2 include first to fourth targets; i.e., 2A, 2B, 2C, and 2D, and are disposed on both side walls. In the apparatus herein, the first to fourth targets; i.e., 2A, 2B, 2C, and 2D, comprise materials A, B, C, and D, respectively.

The target materials A to D each comprise a material which constitutes a magnetic film 23 formed on the disk.

At least one material of materials A to D is a magnetic material, and the remaining materials include at least one non-magnetic material.

The present embodiment will be described taking, as an example, a case in which each of materials A and C comprises a Co/Cr/Pt/Ta alloy serving as a magnetic material and each of materials B and D comprises Cr serving as a non-magnetic material. In this case, targets 2A and 2C serve as magnetic targets formed of a magnetic material, whereas targets 2B and 2D serve as non-magnetic targets formed of a non-magnetic material.

Process 1 is carried out in a manner similar to that employed above with respect to the second embodiment.

Subsequently, the pallet 10 is continuously rotated in the direction of the arrows shown in FIG. 2(A) at a rate of, for example, 11–120 rpm. When the pallet is rotated at a position in which the first to fourth disks 9A to 9D oppose the first to fourth targets 4A to 4D, respectively, sputtering is carried out by use of the first magnetic target 2A formed of material A; i.e., a Co alloy, and the material A is supplied onto both sides of only the first disk 9A through the openings 7b (Process 2).

Subsequently, Processes 3 to 6 are carried out in a manner similar to those employed above with respect to the second embodiment.

Then, the pallet 10 is further rotated by approximately 90°, and the materials A, D, C, and B are supplied onto the first, the fourth, the third, and the second disks 9A, 9D, 9C, and 9B, respectively (Process 7).

Then, the pallet 10 is further rotated by approximately 90°, and the materials, A, D, and C are supplied onto the fourth, third, and second disks 9D, 9C, and 9B, respectively (Process 8).

Then, the pallet 10 is further rotated by approximately 90°, and the materials A and D are supplied onto the third and second disks 9C and 9B, respectively (Process 9).

Next, the pallet 10 is further rotated by approximately 90°, and the material A is supplied onto the second disk 9B (process 10).

In the aforementioned Processes 1 to 10, 3 or more, preferably 5 or more, layers of unit layers 23a and unit layers 23b are formed by appropriately choosing the operation time of a sputtering apparatus and the speed of rotation of the pallet. When the number of the layers 23a or that of the layer 23b is less than 3, a produced magnetic recording medium has poor magnetic characteristics, such as coercive force.

Through Processes 1 to 10 in the above-described example of a method, initially the material A; i.e., a Co alloy, and then the materials B to D are sputtered onto the first to fourth disks 9A to 9D. Subsequently, each of the materials A to D is sputtered sequentially a predetermined number of times. Finally, the material A is sputtered.

Thus, there can be formed a magnetic film 23 in which magnetic unit layers 23a comprising a Co alloy and non-magnetic unit layers 23b comprising Cr are alternately stacked several times and a magnetic layer 23a serves as the outermost layer.

As described above, a magnetic unit layer 23a is initially formed on each of disks 9A to 9D in the course of film formation of a magnetic film 23. The magnetic unit layer 23a is formed of a Co alloy and has an hcp structure. Therefore, a non-magnetic unit layer 23b which is formed thereon is epitaxially grown on the magnetic unit layer 23a and has an excellent crystal structure. Furthermore, another magnetic unit layer 23a which is formed on the non-magnetic unit layer 23b also has an excellent crystal structure. Thus, the aforementioned magnetic recording medium comprises unit layers 23a and 23b having excellent crystal structures, and the magnetic film 23 per se has a favorable crystal structure.

The unit layers 23a and 23b are formed while the pallet 10 is rotated. Thus, after one unit layer is formed, a new unit layer is immediately formed on the unit layer. Accordingly, even though impurities such as oxygen and nitrogen are comprised in a chamber of a sputtering apparatus, migration of the impurities into the aforementioned surface layer can be suppressed to as low a level as possible.

After completion of the above-described Process 10, the shaft 3a of the motor 3 for rotating the pallet is removed from the pallet clamp 11 of the pallet 10, the second gate valve 6b is opened, and the carrier 7 is conveyed from the chamber 1 (Process 11).

Thus, the magnetic film 23 is formed on each of disks 9A to 9D, followed by formation of a protective film 24 thereon through a method, such a customary sputtering method, to thereby obtain a magnetic recording medium.

In the aforementioned method for producing a magnetic recording medium, there is employed a sputtering apparatus in which magnetic targets 2A and 2C comprise a Co alloy serving as a magnetic material and non-magnetic targets 2B and 2D comprise Cr serving as a non-magnetic material. Disks 9A to 9D are held on the pallet 10, and sputtering of the targets 2A to 2D is carried out such that the disks 9A to 9D sequentially oppose the targets 2A to 2D while the pallet 10 is rotated. Thus, a magnetic film 23 in which magnetic unit layers 23a and non-magnetic unit layers 23b are alternately stacked several times is formed on each of the disks 9A to 9D. In this case, since the target employed initially; i.e., the target 2A, is a magnetic target, the innermost layer of the formed magnetic film 23 is a magnetic unit layer 23a.

Accordingly, materials subsequently supplied onto the disk are epitaxially grown on the innermost magnetic unit layer 23a formed of a Co alloy, and the thus-formed magnetic film 23 has a favorable crystal structure, to thereby produce a magnetic recording medium having excellent magnetic characteristics such as coercive force.

As described above, sputtering of the targets 2A to 2D is carried out so that the disks 9A to 9D sequentially oppose the targets 2A to 2D while the pallet 10 is rotated. As a result, after one unit layer is formed, a new unit layer is immediately formed on the unit layer during formation of the magnetic film 23. Thus, a magnetic film 23 can be formed within a short period of time. Even though impurities such as oxygen and nitrogen are present in a chamber of a sputtering apparatus, migration of the impurities into the magnetic film 23 can be suppressed to as low a level as possible.

Thus, a magnetic recording medium having a favorable crystal structure, comprising a low level of impurities, and having an excellent magnetic characteristic can be produced at high efficiency and with ease.

In addition, since a magnetic film 23 can be formed in one chamber, a large-scale apparatus is not needed.

In formation of a magnetic film 23, a magnetic unit layer 23 formed of a magnetic material can be disposed at the outermost layer of the magnetic film by use of target 2A as the target employed finally. Thus, when a magnetic recording medium having the magnetic film 23 is subjected to magnetization, a portion in the vicinity of the surface of the recording medium can serve as a magnetization portion.

Accordingly, the distance between the magnetization portion and a head decreases during a record-reproducing step, thereby providing a magnetic recording medium producing high-intensity record-reproducing signals and having high record-reproducing sensitivity.

The aforementioned magnetic recording medium has a magnetic film 23 in which magnetic unit layers 23a and non-magnetic unit layers are alternately stacked several times; i.e. a multi-layer structure, and a magnetic layer 23a serves as the outermost layer. Therefore, a material supplied onto the magnetic unit layer 23a is epitaxially grown on the magnetic unit layer 23a and the thus-produced magnetic film 23 has an excellent crystal structure, thereby producing a magnetic recording medium having excellent magnetic characteristics such as coercive force.

Since the outermost layer of the magnetic film 23 is a magnetic unit layer 23a, the distance between the aforementioned magnetization portion and a head decreases during a record-reproducing step, thereby providing a magnetic recording medium producing high-intensity record-reproducing signals and having high record-reproducing sensitivity.

In the magnetic recording medium of the above embodiment, the innermost layer of the magnetic film 23 is a magnetic unit layer 23a. However, the recording medium of the present invention may be described as follows.

Figure 8:
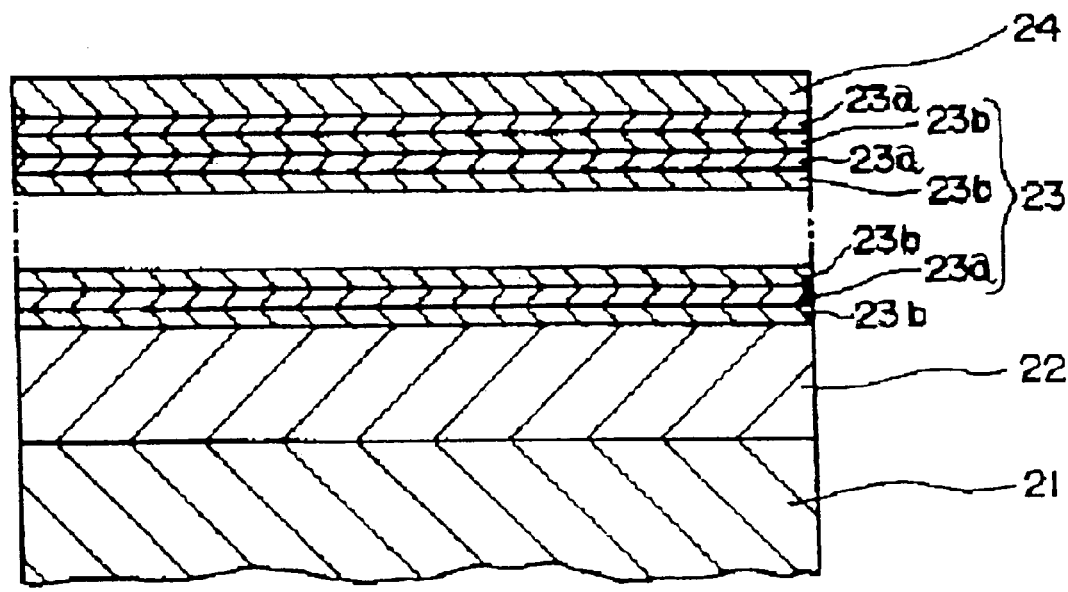
FIG. 8 is a partial cross-sectional view showing another embodiment of the magnetic recording medium of the present invention.

FIG. 8 shows another embodiment of a magnetic recording medium of the present invention. The recording medium shown in FIG. 8 is identical with that shown in FIG. 7, except that the innermost layer of the magnetic film 23 is a non-magnetic unit layer 23b and the layer 23b is formed of a material predominantly comprising Cr.

In order to produce the recording medium as shown herein, at least one non-magnetic target formed of a material predominantly comprising Cr is employed for forming the magnetic film 23, and the target employed initially for forming the magnetic film is formed of the material predominantly comprising Cr.

As described above, Cr has a property which allows epitaxial growth of crystals comprising Co and enhances the crystal structure. In the recording medium of the embodiment, a material supplied onto the non-magnetic unit layer 23b during film formation is epitaxially grown on the basis of the unit layer 23b, to thereby produce a magnetic film 23 having a favorable crystal structure. Thus, a magnetic recording medium having excellent magnetic characteristics can be obtained.

A fourth embodiment of the invention is described below.

FIG. 1 is a schematic representation showing a magnetic recording medium produced in an embodiment of the production method of the present invention. The magnetic recording medium comprises a non-magnetic substrate 21, a non-magnetic undercoat film 22, a magnetic film 23, and a protective film 24, such that the films are successively formed on the substrate.

In this embodiment, at least one of materials A to D comprises a material comprising Cr as a primary component.

The embodiment will be described by taking, as an example, the case in which a Co/Cr/Pt/Ta alloy (hereinafter referred to as "Co alloy"), Cr, Mo, and Ti are employed as materials A to D, respectively.

In this embodiment of the production method, non-magnetic substrates formed of an NiP-plated Al alloy or glass are employed as first to fourth disks 9A to 9D. On each of these disks, a non-magnetic undercoat film 22 is formed through the below-described procedure in which sputtering is carried out several times by sequential use of targets 2B to 2D formed of materials B to D. Subsequently, a magnetic film 23 is formed on the film 22 by use of a target 2A formed of material A.

Process 1 is similar to that described with respect to the second embodiment.

Subsequently, the pallet 10 is rotated continuously in the direction of the arrows shown in FIG. 2(A) at, for example, 11–120 rpm. When the first to fourth disks 9A to 9D are set at positions that oppose the targets 2B, 2C, 2D, and 2A, respectively, sputtering is carried out by use of the target 2B formed of the material B; i.e., Cr, and the material B is supplied onto both sides of the first disk 9A through the openings 7b (Process 2).

Subsequently, the pallet 10 is rotated in the direction of the arrows shown in FIG. 2(A) by approximately 90°. When the first and fourth disks 9A and 9D are set at positions that oppose the target 2C and the target 2B, respectively, the disks 9A and 9D are subjected to sputtering by use of the targets 2C and 2B, and thus the material C is supplied onto the first disk 9A and the material B is supplied onto the fourth disk 9D (Process 3).

Subsequently, the pallet 10 is further rotated by approximately 90°. When the first, the fourth, and the third disks 9A, 9D, and 9C are set at positions that oppose the targets 2D, 2C, and 2B, respectively, the materials D, C, and B are supplied onto the first, the fourth, and the third disks 9A, 9D, and 9C, respectively (Process 4).

Subsequently, the pallet 10 is further rotated by approximately 90°, and the materials D, C, and B are supplied onto the disks 9D, 9C, and 9B, respectively (Process 5–1).

Then, the pallet 10 is further rotated by approximately 90°, and the materials D, C, and B are supplied onto the disks 9C, 9B, and 9A, respectively (Process 5–2).

Subsequently, the pallet 10 is further rotated by approximately 90°, and the materials D, C, and B are supplied onto the disks 9B, 9A, and 9D, respectively (Process 5–3).

Then, the pallet 10 is further rotated by approximately 90°, and the materials D, C, and B are supplied onto the disks 9A, 9D, and 9C, respectively (Process 5–4).

Processes 5–1 to 5–4 are repeated a predetermined number of times.

Subsequently, the pallet 10 is further rotated by approximately 90°, and the materials D, C, and B are supplied onto the disks 9D, 9C, and 9B, respectively (Process 6).

Then, the pallet 10 is further rotated by approximately 90°, and the materials D, C, and B are supplied onto the disks 9C, 9B, and 9A, respectively (Process 7).

Then, the pallet 10 is further rotated by approximately 90°, and the materials D and B are supplied onto the disks 9B and 9D, respectively (Process 8).

Then, the pallet 10 is further rotated by approximately 90°, and the material B is supplied onto the disk 9C (Process 9).

Then, the pallet 10 is further rotated by approximately 90°, and the material B is supplied onto the disk 9B (Process 10).

Processes 1 to 10 in the above-described example of a method, initially the material B; i.e., Cr, and then the materials C and D are sputtered onto the first to fourth disks 9A to 9D. Subsequently, the materials B to D are sputtered sequentially a predetermined number of times each; for example, three or more times.

In the above-described Processes 2–10, the materials B to D; i.e., Cr, Mo, and Ti, which are supplied onto the disks 9A to 9D, diffuse and mix with one another on the disks 9A to 9D to form a non-magnetic undercoat film 22 comprising an alloy of Cr, Mo, and Ti.

As described above, when a non-magnetic undercoat film 22 is formed, a material which is supplied onto the disks 9A to 9D initially; i.e., at the innermost side of the film, is the material B; i.e., Cr.

Therefore, when the material B to D which are then supplied diffuse, form an alloy, and crystallize on the disks, the crystals are epitaxially grown on Cr which is supplied at the innermost side of the film, and thus the non-magnetic undercoat film 22 attains a regularly arranged crystal structure.

When the non-magnetic undercoat film 22 is formed, a material which is finally supplied onto the disks 9A to 9D is the material B; i.e., Cr. Therefore, the concentration of Cr is slightly higher in the vicinity of the surface of the non-magnetic undercoat film 22 as compared with other portions of the film.

After completion of Process 10, sputtering is carried out by use of the target 2A while the pallet 10 is further rotated, and the material A; i.e., Co, is supplied onto each of the disks 9A to 9D on which the non-magnetic undercoat film 22 is formed, thereby forming a magnetic film 23.

As described above, the non-magnetic undercoat film 22 has a favorable crystal structure, and thus the magnetic film 23 is epitaxially grown on the basis of the film 22 and also has a favorable crystal structure.

As described above, the concentration of Cr is slightly higher in the vicinity of the surface of the non-magnetic undercoat film 22 as compared with other portions of the film. Therefore, early-growth-stage epitaxial growth of the magnetic film 23 which is formed on the non-magnetic undercoat film 22 is facilitated, and thus the film 23 has a more favorable crystal structure.

Thus, the non-magnetic undercoat film 22 and the magnetic film 23 are formed on each of the disks 9A to 9D, followed by formation of a protective film 24 thereon through a method, such a customary sputtering method, thereby produce a magnetic recording medium.

In the above-described method for producing a magnetic recording medium, the disks 9A to 9D are held on the rotatable pallet 10, and sputtering is carried out repeatedly by sequential use of the targets 2A to 2D, to form the non-magnetic undercoat film 22 on each of the disks 9A to 9D. In the non-magnetic undercoat film 22, the materials of the targets 2A to 2D are alloyed. In this case, the target employed initially is the target 2B which is formed of the material B; i.e., Cr. Therefore, when the materials B to D which are subsequently supplied diffuse, form an alloy, and crystallize on the disks, the crystals are epitaxially grown on Cr which is supplied to the innermost layer, and thus the formed non-magnetic undercoat film 22 attains a regularly arranged crystal structure.

Thus, the magnetic film 23 formed on the non-magnetic undercoat film 22 is epitaxially grown based on the film 22, and the thus-formed magnetic film 23 attains a favorable crystal structure, to produce a magnetic recording medium having excellent magnetic characteristics, such as coercive force, and an excellent noise characteristic.

As described above, sputtering of the targets 2A to 2D is carried out so that the disks 9A to 9D sequentially oppose the targets 2A to 2D while the pallet 10 is rotated, to form the non-magnetic undercoat film 22. As a result, after one material is supplied to the disk, another material is immediately supplied thereon during formation of the non-magnetic undercoat film 22. Thus, the non-magnetic undercoat film 22 can be formed within a short period of time. Even though impurities such as oxygen and nitrogen are present in a chamber of a sputtering apparatus, migration of the impurities into the magnetic film 23 can be suppressed to as low a level as possible.

Thus, a magnetic recording medium comprising a low level of impurities and having excellent magnetic characteristics can be produced at high efficiency and with ease.

In addition, since the non-magnetic undercoat film 22 can be formed in one chamber, a large-scale apparatus is not needed.

When the target 2B formed of Cr is employed as the final target in formation of the non-magnetic undercoat film 22, the concentration of Cr is slightly higher in the vicinity of the surface of the thus-formed non-magnetic undercoat film 22 as compared with other portions of the film. As a result, the magnetic film 23 formed on the non-magnetic undercoat film 22 has a more favorable crystal structure.

Another embodiment of a method for producing a magnetic recording medium of the present invention will next be described.

In this embodiment of a production method, the above-described substrates 21 on which the non-magnetic undercoat films 22 are formed are employed as disks 9A to 9D. Sputtering is carried out repeatedly by use of the targets 2A to 2D formed of the materials A to D, through the below-described procedure and by use of the apparatus shown in FIGS. 2(A) to 5(B), to thereby form a magnetic film 23 on each of the disks.

Each of the aforementioned materials A to D may be one metal selected from among Co, Fe, Ni, Cr, Pt, Ta, B, Ti, Ag, Cu, Al, Au, W, and Mo, or an alloy of two or more of these metals.

In the embodiment, at least one of the materials A to D comprises Co as a primary component.

This embodiment will be described by taking, as an example, the case in which Co, Cr, Pt, and Ta are employed as materials A to D, respectively.

Disks 9A to 9D are held in a pallet 10, and the pallet 10 is rotated continuously. During this process, initially the material A; i.e., Co, and subsequently the materials B to D are supplied onto each of the disks 9A to 9D, and the materials A to D are supplied repeatedly a predetermined number of times; for example, three or more times, and finally the material A is supplied.

The materials A to D which are supplied onto each of the disks 9A to 9D; i.e., Co, Cr, Pt, and Ta, diffuse and mix with one another on each of the disks, to thereby form a magnetic film 23 comprising a Co/Cr/Pt/Ta alloy.

When the magnetic film 23 is formed as described above, a material which is supplied onto the disks 9A to 9D initially; i.e., at the innermost layer, is the material A; i.e., Co. As described above, Co provides an hcp crystal structure. Therefore, when the materials A to D which are subsequently supplied diffuse, form an alloy, and crystallize on the disk, the crystals are epitaxially grown on the basis of Co which is supplied at the innermost layer. The thus-formed magnetic film 23 has a regularly arranged hcp crystal structure.

In another embodiment of the production method of the present invention, sputtering is carried out repeatedly by sequential use of the targets 2B to 2D while the pallet 10 is rotated, to thereby form the magnetic film 23 on each of the disks 9A to 9D. In the magnetic film, the materials of the targets 2B to 2D are alloyed. In this case, the target employed initially is formed of the material A; i.e., Co, which provides an hcp crystal structure. Therefore, when the materials A to D which are subsequently supplied diffuse, form an alloy, and crystallize on the disk, the crystals are epitaxially grown on the basis of Co which is supplied at the innermost layer. The thus-formed magnetic film 23 has a regularly arranged hcp crystal structure.

Thus, in the same manner as in the previously described embodiment, a magnetic recording medium having excellent aforementioned magnetic characteristics can be produced.

In another embodiment of the production method of the present invention, at least one of the targets 2A to 2D is a target comprising Co as a primary component. However, the present invention is not limited to these embodiment. No particular limitation is imposed on the composition of the target, so long as the target is formed of a magnetic material comprising Co.

In another embodiment of the production method of the present invention, when the magnetic film 23 is formed, the target employed initially is the target 2A formed of the material A; i.e., Co. The method for producing a magnetic recording medium of the present invention is not limited to the embodiment. Namely, the target employed initially may be the target 2B formed of the material B; i.e., Cr.

Thus, in a method in which the target employed initially during formation of the magnetic film 23 is the target 2B formed of Cr, when the materials A to D which are subsequently supplied diffuse, form an alloy, and crystallize on the disk, the crystals are epitaxially grown on Cr which is supplied at the innermost layer in a manner similar to the other above-described embodiments of the production method. The thus-formed magnetic film 23 has a regularly arranged crystal structure.

As a result, a magnetic recording medium having excellent magnetic characteristics such as coercive force can be produced.

EXAMPLES

The present invention will next be described by way of examples, which should not be construed as limiting the invention thereto. The present invention may be arbitrarily varied within the scope of the invention. The present invention is not limited to other examples described herein. Unless otherwise indicated herein, all parts, percents, ratios and the like are by weight.

EXAMPLES OF THE FIRST EMBODIMENT

Example 1

A magnetic recording medium similar to that shown in FIG. 1 was produced by means of a DC magnetron sputtering apparatus (model 3100, product of ANELVA CORPORATION) similar to that shown in FIGS. 2(A) to 5(B), as described below.

Four NiP-plated Al substrates 21, which had been subjected to texturing so as to have a surface roughness Ra of 15 Å, were held in openings 10a of a pallet 10. The pallet 10 and a carrier 7 were conveyed into a chamber (not shown in the Figs.) comprising a target (not shown in the Figs.) formed of a $Cr_{85}Ti_{15}$ alloy, to thereby obtain disks 9A to 9D. In each of the disks, a $Cr_{85}Ti_{15}$ alloy film having a thickness of 200 Å, serving as a non-magnetic undercoat film 22, was formed on the substrate 21.

Subsequently, each of the disks 9A to 9D was subjected to sputtering by use of Co, Cr, Pt, and Ta sequentially, to thereby form a magnetic film 23 on the non-magnetic undercoat film 22.

Targets 2A, 2B, 2C, and 2D formed of Co, Cr, Pt, and Ta, respectively were placed in a chamber 1 in advance, and the pallet 10 and the carrier 7 were conveyed into the chamber 1. Subsequently, the chamber was evacuated to $2 \times 10^{-7}$ Torr, and discharge was carried out continuously for 20 seconds while the pallet 10 was rotated continuously at 45 rpm, to thereby form the magnetic film 23 on each of the disks 9A to 9D.

The thickness of the magnetic film 23 formed through the above procedure was 110 G$\mu$m (product of residual magnetization and film thickness (BrT)). The composition of the magnetic film 23 was Co: 78 at %, Cr: 13.2 at %, Pt: 5.8 at %, and Ta: 3 at %.

Subsequently, a carbon protective film was formed on the magnetic film 23 to a thickness of 150 Å. In the above procedure for forming the films, Ar was employed as a sputtering gas and the pressure of the gas was 3 mTorr.

Magnetic characteristics of the produced magnetic recording medium were measured by use of a vibrating sample magnetometer (VSM), to thereby obtain a coercive force (Hc) of 2700 Oe and a coercive force remanence ratio (S*) of 88.3%. Recording-reproduction characteristics of the medium were measured at a line-recording density of 148.5 KFCI by use of a complex thin-film magnetic head having a magnetoresistance (MR) element in a reproduction portion. The recording-reproduction output and noise of the medium were 250 μV and 2.86 μV, respectively.

The size of magnetic grains in the magnetic film of the medium was measured under a TEM, to obtain a mean grain size of approximately 150 Å.

Comparative Example 1

The procedure of Example 1 was repeated, except that a magnetic film was formed by use of a CoCrPtTa alloy ($Co_{78}Cr_{13}Pt_6Ta_3$), serving as a target has the same composition as that of the magnetic film of the magnetic recording medium produced in Example 1, to thereby produce a magnetic recording medium.

In the same manner as in Example 1, magnetic characteristics and recording-reproduction characteristics of the magnetic recording medium produced in Comparative Example 1 were measured.

The results are as follows: coercive force (Hc) 2760 Oe, coercive force remanence ratio (S*) 85.4%, recording-reproduction output 245 μV, and noise 3.31 μV.

The size of magnetic grains in the magnetic film of the medium was measured under a TEM, to obtain a mean grain size of approximately 180 Å.

Example 2

A magnetic recording medium similar to that shown in FIG. 1 was produced as described below.

Substrates 21; i.e., disks 9A to 9D similar to those shown in Example 1, were held in a pallet 10, and the pallet was set in a chamber 1 of a sputtering apparatus (model 3100, product of ANELVA CORPORATION) similar to that shown in Example 1. Subsequently, the chamber 1 was evacuated to $2 \times 10^{-7}$ Torr, and the disks 9A to 9D were repeatedly subjected to sputtering by use of Cr, Ag, and Ta in a sequential manner as described below, to thereby form a non-magnetic undercoat film 22 on each of the disks.

In the above-described sputtering apparatus similar to that shown in FIGS. 2 to 5, a first target 2A formed of Cr, a second target 2B formed of Ag, and a third target 2C formed of Ta were employed. In the example, a fourth target 2D was not employed.

Discharge was carried out continuously for 30 seconds while the pallet 10 in the apparatus was rotated continuously at 60 rpm, to thereby form a non-magnetic undercoat film 22 on each of the disks 9A to 9D serving as the substrates 21.

The composition of the non-magnetic undercoat film 22 was Cr: 82 at %, Ag: 8 at %, and Ta: 10 at %.

Subsequently, the pallet 10 and a carrier 7 were conveyed into a chamber (not shown in the figures), and a magnetic film 23 was formed on the film 22 by use of a target formed of a CoCrPtTa alloy ($Co_{78}Cr_{13}Pt_6Ta_3$), which target was set in the chamber.

Subsequently, a carbon protective film was formed on the magnetic film, so as to have a thickness of 150 Å.

The thickness of the magnetic film 23 was 110 Gμm (product of residual magnetization and film thickness (BrT)).

Magnetic characteristics and recording-reproduction characteristics of the produced magnetic recording medium were measured. The results are as follows: coercive force (Hc) 2960 Oe, coercive force remanence ratio (S*) 86.5%, recording-reproduction output 248 μV, and noise 2.50 μV.

Comparative Example 2

An attempt was made to produce a magnetic recording medium by use of a CrAgTa alloy ($Cr_{82}Ag_8Ta_{10}$), serving as a target which has the same composition as that of the non-magnetic undercoat film of the magnetic recording medium produced in Example 2. However, cracks formed in the target, and a non-magnetic undercoat film could not be formed.

Example 3

A magnetic recording medium similar to that shown in FIG. 1 was produced as described below.

Substrates 21; i.e., disks 9A to 9D similar to those shown in Example 1, were held in a pallet 10, and the pallet was set in a chamber 1 of a sputtering apparatus (model 3100, product of ANELVA CORPORATION) similar to that shown in Example 1.

Subsequently, the chamber 1 was evacuated to $2\times10^{-7}$ Torr, and the disks 9A to 9D were repeatedly subjected to sputtering by use of Cr and Ti in a sequential manner as described below, to thereby form a non-magnetic undercoat film 22 on each of the disks 9A to 9D serving as the substrates 21.

In the above-described sputtering apparatus similar to that shown in FIGS. 2(A) to 5(B), first and third targets 2A and 2C formed of Cr and second and fourth targets 2B and 2D formed of Ti were employed.

Discharge was carried out continuously for 30 seconds while the pallet 10 in the apparatus was rotated continuously at 60 rpm, to thereby form a non-magnetic undercoat film 22.

Subsequently, a magnetic film 23 was formed on the film 22 by use of a target formed of a CoCrPtTa alloy ($Co_{78}Cr_{13}Pt_6Ta_3$).

The thickness of the magnetic film 23 was 110 Gμm (product of residual magnetization and film thickness (BrT)).

Subsequently, a carbon protective film was formed on the magnetic film, so as to have a thickness of 150 Å.

The composition of the non-magnetic undercoat film 22 was Cr: 85 at % and Ti: 15 at %.

The concentration of oxygen present as an impurity in the Cr target and in the Ti target was 40 ppm and 50 ppm, respectively.

Magnetic characteristics and recording-reproduction characteristics of the produced magnetic recording medium were measured. The results are as follows: coercive force (Hc) 2930 Oe, coercive force remanence ratio (S*) 88.0%, recording-reproduction output 268 μV, and noise 2.62 μV.

Also, the medium was subjected to measurement through secondary ion mass spectrometry (SIMS). As a result, the intensity of $^{16}O$ in the non-magnetic undercoat film 22 was found to be 0.10, which value was corrected by use of the intensity of $^{31}P$ in the NiP-plated layer of the substrate 21.

Comparative Example 3

The procedure of Example 3 was repeated, except that a non-magnetic undercoat film was formed by use of a CrTi alloy ($Cr_{85}Ti_{15}$), serving as a target has the same composition as that of the non-magnetic undercoat film of the magnetic recording medium produced in Example 3, to thereby produce a magnetic recording medium. The concentration of oxygen present as an impurity in the CrTi alloy target was 200 ppm.

Magnetic characteristics and recording-reproduction characteristics of the produced magnetic recording medium were measured. The results are as follows: coercive force (Hc) 2760 Oe, coercive force remanence ratio (S*) 85.4%, recording-reproduction output 245 μV, and noise 3.31 μV.

Also, the medium was subjected to measurement through SIMS. As a result, the intensity of $^{16}O$ in the non-magnetic undercoat film was found to be 0.21, which value was corrected by use of the intensity of $^{31}P$ in the NiP-plated layer of the substrate 21.

Example 4

A magnetic recording medium similar to that shown in FIG. 1 was produced as described below.

Substrates 21; i.e., disks 9A to 9D similar to those shown in Example 1, were held in a pallet 10, and the pallet was set in a chamber 1 of a sputtering apparatus (model 3100, product of ANELVA CORPORATION) similar to that shown in Example 1.

Subsequently, the chamber 1 was evacuated to $2\times10^{-7}$ Torr, and the disks 9A to 9D were repeatedly subjected to sputtering by use of Cr and Ti in a sequential manner as described below, to thereby form a non-magnetic undercoat film 22 on each of the disks 9A to 9D serving as the substrates 21.

In the above-described sputtering apparatus similar to that shown in FIGS. 2(A) to 5(B), first and third targets 2A and 2C formed of Cr and second and fourth targets 2B and 2D formed of Ti were employed.

Discharge was carried out continuously for 30 seconds while the pallet 10 in the apparatus was rotated continuously at 60 rpm, to thereby form a non-magnetic undercoat film 22.

Subsequently, targets 2A to 2D formed of Co, Cr, Pt, and Ta, respectively were set in a chamber 1 of a sputtering apparatus similar to that shown in FIGS. 2(A) to 5(B). Each of the disks 9A to 9D on which the non-magnetic undercoat film 22 was formed was held in a pallet 10, and the pallet 10 and a carrier 7 were conveyed into the chamber 1. Discharge was carried out continuously for 20 seconds while the pallet 10 was rotated continuously at 45 rpm, to thereby form a magnetic film 23 on each of the disks 9A to 9D.

The composition of the non-magnetic undercoat film 22 produced through the above procedure was Cr: 85 at % and Ti: 15 at %. The composition of the magnetic film 23 was Co: 78 at %, Cr: 13.2 at %, Pt: 5.8 at %, and Ta: 3 at %. The thickness of the magnetic film 23 was 110 Gμm (product of residual magnetization and film thickness (BrT)).

Subsequently, a protective carbon film was formed on the magnetic film, so as to have a thickness of 150 Å.

Magnetic characteristics and recording-reproduction characteristics of the produced magnetic recording medium were measured. The results are as follows: coercive force (Hc) 2960 Oe, coercive force remanence ratio (S*) 89.2%, recording-reproduction output 269 μV, and noise 2.58 μV.

Comparative Example 4

The procedure of Example 4 was repeated, except that a non-magnetic undercoat film was formed by use of a CrTi alloy ($Cr_{85}Ti_{15}$), serving as a target has the same composition as that of the non-magnetic undercoat film of the magnetic recording medium produced in Example 4, and that a magnetic film was formed by use of a CoCrPtTa alloy ($Co_{78}Cr_{13}Pt_6Ta_3$), serving as a target has the same composition as that of the magnetic film of the magnetic recording medium produced in Example 4, to thereby produce a magnetic recording medium.

Magnetic characteristics and recording-reproduction characteristics of the magnetic recording medium of Comparative Example 4 were measured. The results are as follows: coercive force (Hc) 2780 Oe, coercive force remanence ratio (S*) 86.1%, recording-reproduction output 244 µV, and noise 3.28 µV.

As is apparent from the above results, in a magnetic recording medium produced through the production method of Example 1 in which a magnetic film is formed by repeatedly carrying out sputtering by use of a plurality of targets in a sequential manner, the size of magnetic grains in the magnetic film is reduced and noise characteristic is greatly improved as compared with that produced through the method of Comparative Example 1 in which a magnetic film is formed by carrying out sputtering by use of an alloy target which has the same composition as that of the magnetic film of the medium of Example 1.

It is also apparent from the above results, in the method of Comparative Example 2 in which an alloy target formed of Cr, Ag, and Ta was employed, the target was broken and a non-magnetic undercoat film could not be formed. In contrast, in the production method of Example 2 in which three targets formed of Cr, Ag, and Ta were employed, a non-magnetic undercoat film comprising an alloy of Cr, Ag, and Ta was formed with ease.

It is also apparent from the above results, in the production method of Example 3 in which two targets formed of Cr and Ti were employed to thereby form a non-magnetic undercoat film comprising a CrTi alloy, the concentration of oxygen present as an impurity in the targets is lower compared with that in a target employed in Comparative Example 3. Therefore, in a magnetic recording medium produced in Example 3, the amount of impurity present in a non-magnetic undercoat film was lowered, and noise characteristic of the medium was enhanced, and other magnetic characteristics such as coercive force were greatly improved, compared with a magnetic recording medium produced in Comparative Example 3 in which a non-magnetic film was formed by use of a CrTi alloy target.

It is also apparent from the above results, in the method of Example 4 in which sputtering is repeatedly carried out by use of a plurality of targets in a sequential manner to thereby form both a non-magnetic undercoat film and a magnetic film, the produced magnetic recording medium has excellent magnetic characteristics, compared with that produced in Comparative Example 4 in which a non-magnetic undercoat film and a magnetic film were formed by use of an alloy target which has the same composition as that of the films. It is also apparent from the results that the magnetic recording medium produced in Example 4 has greatly improved magnetic characteristics as compared with that produced in the methods in Example 1 to 3 in which either a non-magnetic undercoat film or magnetic film is formed by repeatedly carrying out sputtering as described above.

As described above, in an embodiment of the method for producing a magnetic recording medium of the present invention, a non-magnetic undercoat film and/or a magnetic film are formed by carrying out sputtering repeatedly by use of a plurality of targets formed of a plurality of materials. Therefore, noise characteristic and magnetic characteristics such as coercive force of the produced magnetic recording medium can be enhanced, as compared with the case in which an alloy or complex of the materials is employed as a target.

A target which is employed in the method comprises a portion of materials of a film to be formed. Thus, even when an alloy having the same composition as that of the film has low mechanical strength, the target has sufficient strength, and accidents such as breakage of the target can be prevented, to thereby enable efficient production of a magnetic recording medium.

In the first embodiment of the method, the amount of impurities present in a film to be formed can be lowered, as compared with the case employing a composite target formed of a composite comprising the above-described materials, which target tends to comprise large amounts of impurities. Therefore, in the first embodiment of the method, a magnetic recording medium which has excellent magnetic characteristics and comprises low amounts of impurities can be produced easily and efficiently.

Furthermore, the composition of a film to be formed can be varied by means of simple operation; for example, by appropriately regulating operative conditions during sputtering, such as the amount of electric power supplied to a target. Therefore, in the method, many types of films can be formed by use of a few targets, as compared with the case in which a target having the same composition as that of a film to be formed. As a result, a magnetic recording medium can be produced with ease, to thereby enhance productivity of the medium and reduce production cost.

In addition, the magnetic recording medium of the present invention has an excellent noise characteristic and excellent magnetic characteristics such as coercive force.

EXAMPLES OF THE SECOND EMBODIMENT

Examples 5 to 7

Magnetic recording media similar to those shown in FIG. 1 and FIG. 6 were fabricated by use of a DC magnetron sputtering apparatus (model 3100, product of ANELVA CORPORATION) having a structure similar to that shown in FIGS. 2(A) to 5(B).

Disks 9A to 9D were obtained in a manner similar to that employed in Example 1.

A magnetic film 23 was formed on a non-magnetic film 22 of each of the aforementioned disks 9A to 9D through sequential and repeated sputtering of Co, Cr, Pt, and Ta onto the disks in the following manner.

Into a chamber 1 provided with targets 2A to 2D, each comprising Co, Cr, Pt, or Ta, the aforementioned pallet 10 was conveyed with a carrier 7. Subsequently, the chamber 1 was evacuated to $2 \times 10^{-7}$ Torr. Discharge was carried out continuously for 20 seconds, while the pallet 10 was rotated continuously at 90 rpm, to thereby form the aforementioned magnetic film 23 on each of the disks 9A to 9D.

A protective film 24 comprising carbon was formed on the aforementioned magnetic film 23 such that the protective film attained a thickness of 150 Å. During formation of each film, Ar was employed as a sputtering gas at 3 mTorr.

During the aforementioned procedure, parameters such as electric power supplied to the targets 2A to 2D and interior temperature of the chamber 1 were appropriately modified, to thereby fabricate five magnetic recording media, the respective compositions of the magnetic films 23 differing from one another.

The thus-formed magnetic films 23 included in the recording media fabricated in Examples 5 to 7 comprised a Co/Cr/Pt/Ta alloy and had a thickness of 110 Gμm (product of residual magnetization and film thickness).

Observation under a TEM of the magnetic films 23 of the recording media fabricated in Examples 5 to 7 revealed that each magnetic film 23 has a structure such that a number of magnetic grains 23e are separated from one another by a grain boundary phase 23f.

The mean grain size of magnetic grains 23e and the mean intergrain distance in the grain boundary phase 23f were measured. The results are shown in Table 1. The respective compositions of magnetic grains 23e and the grain boundary phase 23f were determined by use of a field-emission transmission electron microscope. These results are also shown in Table 1. The respective ratios of the Cr concentration of the grain boundary phase 23f represented by $c_2$ to that of magnetic grains 23e represented by $c_1$; i.e., $c_2/c_1$, are also shown in Table 1.

The magnetic characteristics and recording-reproduction characteristics were measured in the aforementioned manner. These results are also shown in Table 1.

Comparative Examples 5 and 6

The procedure of Example 5 was repeated, except that a magnetic film was formed through a customary sputtering method employing a target comprising a Co/Cr/Pt/Ta alloy, to thereby fabricate magnetic recording media. The interior temperature of the chamber during film formation was appropriately modified, to thereby fabricate two magnetic recording media, the respective compositions of magnetic grains and the grain boundary phase differing from each other (Comparative Examples 5 and 6).

The mean grain size of magnetic grains in the magnetic films, the mean intergrain distance in the grain boundary phase, the ratio of the component in magnetic grains to that in the grain boundary phase, and the magnetic characteristics and recording-reproduction characteristics of the thus-obtained magnetic recording media were measured in manners similar to those employed in Example 5, and the results are shown in Table 1.

TABLE 1

| | Magnetic grains | | | | | Grain boundary phase | | | | | | | | | |
|---|---|---|---|---|---|---|---|---|---|---|---|---|---|---|---|
| | Size | Compositional proportions (at %) | | | | Thickness | Compositional proportions (at %) | | | | | Hc | S* | Output | Noise |
| | (Å) | Co | Cr | Pt | Ta | (Å) | Co | Cr | Pt | Ta | C2/C1 | (Oe) | (%) | (μV) | (μV) |
| Ex. 5 | 120 | 78 | 13 | 6 | 3 | 15 | 69 | 22 | 6 | 3 | 1.69 | 2700 | 88.3 | 250 | 2.86 |
| Ex. 6 | 140 | 79 | 12 | 6 | 3 | 20 | 67 | 24 | 6 | 3 | 2.00 | 2900 | 86.0 | 246 | 2.63 |
| Ex. 7 | 110 | 81 | 10 | 6 | 3 | 13 | 70 | 21 | 6 | 3 | 2.10 | 2800 | 89.0 | 255 | 3.01 |
| Comp. Ex. 5 | 120 | 81 | 10 | 6 | 3 | 8 | 78 | 13 | 6 | 3 | 1.30 | 2760 | 85.4 | 245 | 3.31 |
| Comp. Ex. 6 | 140 | 79 | 12 | 6 | 3 | 5 | 77 | 14 | 6 | 3 | 1.17 | 2500 | 88.0 | 250 | 3.80 |

As is clear from Table 1, the recording media fabricated in Examples 5 to 7 exhibit high coercive force and excellent noise characteristics. Each recording medium has a magnetic film 23 formed through sequential and repeated sputtering by use of a plurality of targets; a mean intergrain distance in the grain boundary phase 23f of 10 Å or more; a $c_2/c_1$ of 1.4 or more; and a Cr concentration represented by $c_2$ of 15 at % or more.

In contrast, recording media fabricated in Comparative Examples 5 and 6 exhibit poor noise characteristics. The recording media have a magnetic film which was formed through a customary sputtering method employing a target comprising a Co/Cr/Pt/Ta alloy and average intergrain distances in the grain boundary phase of 8 Å and 5 Å, respectively.

As described hereinabove, the recording medium of the present invention, having an intergrain distance in the grain boundary phase of 10 Å or more, maintains sufficient distance between magnetic grains and suppresses exchange interaction between magnetic grains to a low level. Thus, noise attributed to grains can be suppressed and a noise characteristic can be enhanced.

In addition, since the grain boundary phase and the magnetic grains comprise the same constitutional elements, the crystal structure of the grain boundary phase is almost identical with that of the magnetic grains. Thus, the magnetic film has a uniform structure, and magnetic characteristics such as coercive force can be enhanced.

Furthermore, the ratio of the Cr concentration of the grain boundary phase represented by $c_2$ to that of magnetic grains represented by $c_1$; i.e., $c_2/c_1$, is adjusted to 1.4 or more, to thereby render difficult magnetization of the grain boundary phase while maintaining the crystal structure of the grain boundary phase in a favorable state.

Therefore, exchange interaction between magnetic grains is suppressed, and a noise characteristic can be enhanced without lowering coercive force.

Examples of the Third Embodiment

Examples 8 to 10

Magnetic recording media similar to those shown in FIG. 7 were produced by means of a DC magnetron sputtering apparatus (model 3100, product of ANELVA CORPORATION) similar to that shown in FIGS. 2(A) to 5(B), as described below.

By use of a sputtering target comprising Cr or a $Cr_{85}Ti_{15}$ alloy, a non-magnetic undercoat film 22 comprising Cr or a $Cr_{85}Ti_{15}$ alloy was formed to a thickness of 400 Å on each of four NiP-plated Al substrates 21, which had been subjected to texturing so as to have a surface roughness Ra of 15 Å, to thereby obtain disks 9A to 9D.

Subsequently, as described below, each of the disks 9A to 9D was repeatedly subjected to sequential sputtering by use of a Co alloy ($Co_{78}Cr_{13}Pt_6Ta_3$), and Cr or Ag, to thereby form a magnetic film 23 on each of the disks. The magnetic film 23 had a structure in which magnetic unit layers 23a comprising a Co alloy and non-magnetic unit layers 23b comprising Cr or Ag were stacked alternately.

Specifically, each of disks 9A to 9D was pre-heated to 220° C., held on a pallet 10, and conveyed into the chamber 1. In the chamber 1, there were provided targets 2A to 2D comprising a Co alloy, Cr, a Co alloy, and Cr, respectively; or targets 2A to 2D comprising a Co alloy, Ag, a Co alloy, and Ag, respectively.

Subsequently, the chamber 1 was evacuated to $2 \times 10^{-7}$ Torr, and the targets 2A to 2D were subjected to continuous discharge while the pallet 10 was rotated continuously, to thereby form the magnetic film 23 on each of the disks 9A to 9D. The magnetic film 23 had a structure in which magnetic unit layers 23a and non-magnetic unit layers 23b were alternately stacked. The time for film formation on a disk was adjusted to 1.0 second per target, and the time for transfer of a disk between targets was adjusted to 0.3 seconds.

When the magnetic film 23 was formed in the above-described manner, the target 2A comprising a Co alloy was initially employed so as to form a magnetic unit layer 23a at the innermost layer of the magnetic film 23.

In Examples 8 and 9, the target 2A comprising a Co alloy was finally employed so as to form a magnetic unit layer 23a at the outermost layer of the magnetic film 23.

Subsequently, a protective film comprising carbon was formed on the magnetic film 23 such that the film has a thickness of 150 Å. In the above procedure for forming the films, Ar was employed as a sputtering gas and the pressure of the gas was 3 mTorr.

The magnetic characteristics and the recording-reproduction characteristics of the produced magnetic media were investigated in the same manners as described above. Specifically, coercive force (Hc), squareness ratio (S*), residual magnetization-film thickness product (BrT), and S/N ratio were measured. The intensity attributed to $^{16}O$ in the magnetic film 23 was also measured through secondary ion mass spectrometry (SIMS).

The results are shown in Table 3. The intensity attributed to $^{16}O$ was corrected by use of that attributed to $^{31}P$ comprised in the NiP-plate layer of the non-magnetic substrate 21.

Comparative Examples 7 to 9

On each of disks 9A to 9D similar to those shown in Examples 8 to 10, a magnetic film shown in Table 1 was formed by use of a sputtering apparatus similar to that used in Examples 8 to 10.

The magnetic characteristics, the recording-reproduction characteristics, and the intensity attributed to $^{16}O$ in the magnetic film of the obtained magnetic recording medium were investigated in the same manners as in Example 8.

Comparative Example 10

A magnetic film was formed on an NiP-plated Al substrate by use of a sputtering apparatus employing a static counter film-formation mode.

Specifically, the sputtering apparatus had a first chamber provided with a target comprising a Co alloy, and a second chamber provided with a target comprising Cr. In the first chamber, a magnetic unit layer comprising a Co alloy was formed on the disk, and the processed disk was moved to the second chamber. In the second chamber, a non-magnetic unit layer comprising Cr was formed. By repetition of these processes, a magnetic recording medium having a composition shown in Table 2 was obtained.

The magnetic characteristics, the recording-reproduction characteristics, and the intensity attributed to $^{16}O$ in the magnetic film of the obtained magnetic recording medium were investigated in the same manners as in Example 8.

TABLE 2

| | Non-magnetic undercoat film | | Magnetic film | | | | | | | |
|---|---|---|---|---|---|---|---|---|---|---|
| | | | Magnetic unit layer | | | Non-magnetic unit layer | | | | |
| | Material | Thickness (Å) | Material | Thickness (Å) | Number of layers | Material | Thickness (Å) | Number of layers | Innermost layer | Outermost layer | Intensity attributed to oxygen |
| Ex. 8 | Cr | 400 | Co alloy | 40 | 5 | Cr | 10 | 4 | Mag. | Mag. | 0.10 |
| Ex. 9 | Cr15Ti | 400 | Co alloy | 35 | 7 | Ag | 5 | 6 | Mag. | Mag. | 0.11 |
| Ex. 10 | Cr15Ti | 400 | Co alloy | 35 | 7 | Ag | 5 | 7 | Mag. | Non. | 0.13 |
| Comp. Ex. 7 | Cr | 400 | Co alloy | 250 | 1 | — | — | 0 | Mag. | Mag. | — |
| Comp. Ex. 8 | Cr | 400 | Co alloy | 120 | 2 | Cr | 30 | 1 | Mag. | Mag. | 0.14 |
| Comp. Ex. 9 | Cr15Ti | 400 | Co alloy | 35 | 7 | Ag | 5 | 7 | Non. | Mag. | 0.12 |
| Comp. Ex. 10 | Cr | 400 | Co alloy | 40 | 5 | Cr | 10 | 4 | Mag. | Mag. | 0.26 |

Mag.: Magnetic unit layer,
Non.: Non-magnetic unit layer

TABLE 3

| | Hc (Oe) | S* (%) | Brδ (Gμm) | S/N ratio (dB) |
|---|---|---|---|---|
| Example 8 | 2789 | 80.2 | 110 | 35.8 |
| Example 9 | 2559 | 81.2 | 106 | 36.2 |
| Example 10 | 2540 | 81.0 | 108 | 35.3 |
| Comp. Ex. 7 | 2643 | 82.1 | 112 | 34.4 |
| Comp. Ex. 8 | 2688 | 81.5 | 110 | 34.3 |
| Comp. Ex. 9 | 2269 | 75.8 | 104 | 34.0 |
| Comp. Ex. 10 | 2153 | 76.2 | 113 | 35.0 |

In Examples 8 to 10, sputtering by use of each magnetic targets 2A and 2C, and non-magnetic targets 2B and 2D was repeated three or more times sequentially, resulting in formation of a magnetic film 23 in which magnetic unit layers 23a and non-magnetic unit layers 23b are alternately stacked. The target initially employed for forming a magnetic film 23 was the magnetic target 2A. Thus, as is apparent from the above results, the magnetic recording media obtained in Examples 8 to 10 have magnetic characteristics more excellent than those of the magnetic recording medium obtained in Comparative Example 9 in which the target employed initially was a non-magnetic target.

It is also apparent from the above results that the magnetic recording media obtained in Examples 8 to 10 have excellent magnetic characteristics in terms of coercive force, S/N ratio, etc. compared with the magnetic recording medium obtained in Comparative Example 10 in which a sputtering apparatus of a conventional static counter film-formation mode was employed.

In Examples 8 to 10, sputtering by use of each magnetic targets and non-magnetic targets was repeated three or more times sequentially, resulting in formation of a magnetic film 23 of a multi-layer structure. As is also apparent from the above results, the magnetic recording media obtained in Examples 8 to 10 had excellent magnetic characteristics compared with the magnetic recording medium obtained in Comparative Example 7, in which a magnetic film was single layered, or the magnetic recording medium obtained in Comparative Example 8, in which a magnetic film was formed by two magnetic layers and one non-magnetic layer.

It is also apparent from the above results that among the magnetic recording media obtained in Examples 8 to 10, the magnetic recording media obtained in Examples 8 and 9, in which a magnetic unit layer 23a was formed at the outermost layer, exhibited remarkably excellent recording-reproduction output.

As described hereinabove, the third embodiment of the method for producing a magnetic recording medium according to the present invention provides a magnetic film having a favorable crystal structure, and can produce a magnetic recording medium having excellent magnetic characteristics such as coercive force at high efficiency and with ease.

In addition, even though impurities such as oxygen and nitrogen are comprised in a chamber of a sputtering apparatus, migration of the impurities into the magnetic film can be suppressed to as low a level as possible.

Thus, a magnetic recording medium having a favorable structure, comprising only low levels of impurities, and having excellent magnetic characteristics can be obtained.

Furthermore, the magnetic recording medium of the present invention has excellent magnetic characteristics, such as coercive force.

EXAMPLES OF THE FOURTH EMBODIMENT

Examples 11 and 12

A magnetic recording medium similar to that shown in FIG. 1 was produced by means of a DC magnetron sputtering apparatus (model 3100, product of ANELVA CORPORATION) similar to that shown in FIGS. 2(A) to 5(B), as described below.

In the following manner, a non-magnetic undercoat film 22 and a magnetic film 23 were formed on disks 9A to 9D, which are NiP-plated Al substrates 21 subjected to texturing so as to have a surface roughness Ra of 15 Å.

Each of the aforementioned disks 9A to 9D pre-heated to 220° C. was held on a pallet 10 and conveyed into a chamber 1. In the chamber 1, there were provided targets 2A to 2D comprising a Co alloy ($Co_{78}Cr_{13}Pt_6Ta_3$), Cr, Mo, and Ti, respectively.

Subsequently, the chamber 1 was evacuated to $2 \times 10^{-7}$ Torr, and a non-magnetic undercoat film 22 was formed on each of the disks 9A to 9D through sputtering by use of the targets 2B to 2D while the pallet 10 was rotated continuously at 60 rpm, the undercoat film 22 comprising an alloy which was formed by alloying the materials of targets 2B to 2D.

The time for film formation on a disk was adjusted to 1.0 second per target, and the time for transfer of a disk between targets was adjusted to 0.3 seconds.

When the non-magnetic film 22 was formed in the above-described manner, the target employed initially was the target 2B comprising Cr, so as to supply Cr to the innermost layer of the non-magnetic film 22.

In Example 11, the target employed finally was the target 2B comprising Cr.

EPMA analysis revealed that the non-magnetic films 22 formed in Examples 11 and 12 has the following composition: Cr: 71 at %, Ti: 15 at %, and Mo: 4 at %.

Subsequently, a magnetic film 23 comprising a Co alloy was formed on the non-magnetic film 22 by use of a sputtering apparatus provided with target 2A comprising material A; i.e., a Co alloy. Then, a protective film comprising carbon was formed on the magnetic film 23 to a thickness of 150 Å. In the above procedure for forming the films, Ar was employed as a sputtering gas and the pressure of the gas was 3 mTorr.

Examples 13 and 14

The magnetic recording medium having a constitution as shown in FIG. 1 was produced through the below-described operation.

A non-magnetic undercoat film comprising Cr was formed by use of a sputtering target comprising Cr on each of four NiP-plated Al substrates 21 which had been subjected to texturing so as to have a surface roughness Ra of 15 Å. Disks 9A to 9D coated with the non-magnetic undercoat film having a thickness of 400 Å were obtained.

Subsequently, a magnetic film 23 was formed on each of the disks 9A to 9D in the following manner.

Specifically, targets 2A to 2D comprising Co, Cr, Pt, and Ta, respectively were provided in the chamber 1 in advance. The aforementioned pallet 10 was conveyed into the chamber 1, and Co, Cr, Pt, and Ta were sequentially and repeatedly sputtered onto the disks 9A to 9D while the pallet was rotated at 60 rpm. A magnetic film 23 comprising an alloy which was formed by alloying the target materials was provided on each of the disks.

When the magnetic film 23 was formed in the above-described manner, the target employed initially was the target 2A comprising Co in Example 13 and the target 2B comprising Cr in Example 14.

The magnetic films 23 formed in Examples 13 and 14 had the following composition: Co: 78 at %, Cr: 13 at %, Pt: 6 at %, and Ta: 3 at %.

Subsequently, a protective film comprising carbon was formed on the magnetic film 23 to a thickness of 150 Å.

The magnetic characteristics and recording-reproduction characteristics of magnetic recording media obtained in Examples 11 to 14 were obtained through measurement in manners similar to those mentioned above. The results are shown in Table 4.

Comparative Example 11

On disks 9A to 9D similar to those shown in Examples 11 and 12 (NiP-plated Al substrates), non-magnetic undercoat films were provided by use of a sputtering apparatus similar to that employed in Examples 11 and 12.

The target employed initially was the target 2D formed of Ti, and Ti was supplied to the innermost layer of the non-magnetic undercoat film.

A magnetic film and a protective film were formed in the same manner as in Examples 11 and 12.

The magnetic film and the protective film were provided on the non-magnetic undercoat film in the same manner as in Examples 11 and 12.

Comparative Example 12

On disks 9A to 9D similar to those shown in Examples 11 and 12 (NiP-plated Al substrates), non-magnetic undercoat films formed of a $Cr_{85}Ti_{15}$ alloy were formed by use of a sputtering apparatus provided with a target formed of a $Cr_{85}Ti_{15}$ alloy. In this case, a conventional static counter mode sputtering apparatus was employed.

A magnetic film and a protective film were provided on the non-magnetic undercoat film in the same manner as in Examples 11 and 12.

Comparative Example 13

On disks 9A to 9D similar to those shown in Examples 13 and 14 (the disk comprising a non-magnetic undercoat film formed of Cr (thickness: 400 Å) formed on an NiP-plated Al substrate), magnetic films were formed by use of a sputtering apparatus similar to that employed in Example 13.

During formation of the magnetic film, the target employed initially was the target 2C formed of Pt, and Pt was supplied to the innermost layer of the magnetic film.

Comparative Example 14

On disks 9A to 9D similar to those shown in Examples 13 and 14 (the disk comprising a non-magnetic undercoat film 22 formed of Cr (thickness: 400 Å) formed on an NiP-plated Al substrate), magnetic films formed of a $Co_{78}Cr_{13}Pt_6Ta_3$ alloy were formed by use of a sputtering apparatus provided with a target formed of the Co alloy. In this case, a conventional static counter mode sputtering apparatus was employed.

The magnetic recording media produced in Comparative Examples 11 to 14 were subjected to measurement of magnetic characteristics and recording-reproduction characteristics in the same manners as in Examples 11 and 12. The results are shown in Table 4.

TABLE 4

| | Non-magnetic undercoat film | | Magnetic film | | | | | |
|---|---|---|---|---|---|---|---|---|
| | Initial target material | Final target material | Initial target material | Final target material | Hc (Oe) | S* (%) | Brδ (Gμm) | S/N ratio (dB) |
| Ex. 11 | Cr | Cr | Co/Cr/Pt/Ta alloy | | 2864 | 86.4 | 110 | 35.5 |
| Ex. 12 | Cr | Mo | Co/Cr/Pt/Ta alloy | | 2598 | 84.4 | 114 | 34.5 |
| Ex. 13 | Cr | | Co | Co | 2726 | 85.3 | 112 | 35.6 |
| Ex. 14 | Cr | | Cr | Co | 2794 | 85.0 | 112 | 35.4 |
| Comp. Ex. 11 | Ti | Cr | Co/Cr/Pt/Ta alloy | | 2476 | 84.5 | 112 | 34.2 |
| Comp. Ex. 12 | Cr/Ti alloy | | Co/Cr/Pt/Ta alloy | | 2662 | 85.0 | 110 | 34.9 |
| Comp. Ex. 13 | Cr | | Pt | Co | 2461 | 82.0 | 110 | 34.6 |
| Comp. Ex. 14 | Cr | | Co/Cr/Pt/Ta alloy | | 2420 | 83.1 | 112 | 34.4 |

As is apparent from the above results, the magnetic recording medium produced through the method of Examples 11 and 12 has excellent magnetic characteristics, such as coercive force, and excellent noise characteristic, compared with the magnetic recording medium produced through the method of Comparative Example 12. In Examples 11 and 12, non-magnetic undercoat films 22 comprising a Cr/Mo/Ti alloy were formed on disks 9A to 9D by repeatedly carrying out sputtering by use of targets 2B to 2D formed of Cr, Mo, Ti, respectively, and the target employed initially was formed of material B; i.e., Cr. Meanwhile, in Comparative Example 12, a non-magnetic undercoat film was formed of a Cr/Ti alloy by use of a sputtering apparatus provided with a target formed of the Cr/Ti alloy.

It is also apparent from the results that the magnetic recording medium produced in Example 11 and 12 are excellent in terms of the aforementioned magnetic characteristics, compared with the magnetic recording medium produced in Comparative Example 11 in which the target employed initially is the target 2D formed of Ti.

As is also apparent from the results, a magnetic recording medium which is more excellent in terms of the aforementioned magnetic characteristics can be produced through the method of Example 11 among the methods of Examples 11 and 12, in which the target finally employed during formation of a non-magnetic undercoat film 22 is the target 2B formed of Cr.

As is also apparent from the results, the magnetic recording medium produced in Examples 13 and 14 are excellent in terms of the aforementioned magnetic characteristics compared with the magnetic recording medium produced in Comparative Example 14. In Examples 13 and 14, sputtering of Co, Cr, Pt, and Ta was repeatedly carried out on disks 9A to 9D, to provide a magnetic film 23 on each of the disks, and the films comprised a Co alloy, which is formed by alloying of these materials. Meanwhile, in Comparative Example 14, a magnetic film is formed by use of a sputtering apparatus provided with a target formed of a Co alloy.

It is also apparent from the results that the magnetic recording medium produced in Examples 13 and 14 are excellent in terms of the aforementioned magnetic characteristics compared with the magnetic recording medium produced in Comparative Example 13. In Example 13 and 14, the target employed initially is the target 2A formed of Co or the target 2B formed of Cr. Meanwhile, in Comparative Example 13, the target employed initially is the target 2C formed of Pt.

As described above, in the fourth embodiment of the method for producing a magnetic recording medium of the present invention, a non-magnetic undercoat film and/or a magnetic film having a favorable crystal structure can be formed, and a magnetic recording medium having excellent magnetic characteristics such as coercive force can be produced at high efficiency and with ease.

In addition, even when impurities such as oxygen and nitrogen are comprised in a chamber of a sputtering apparatus, migration of the impurities into films can be suppressed to as low a level as possible. Thus, a magnetic recording medium comprising a low level of impurities and having excellent magnetic characteristics can be produced.

While the invention has been described in detail and with reference to specific embodiments thereof, it will be apparent to one skilled in the art that various changes and modifications can be made therein without departing from the spirit and scope thereof.

What is claimed is:

1. A magnetic recording medium comprising (1) a non-magnetic substrate, (2) a non-magnetic undercoat film, (3) a magnetic film, and (4) a protective film, wherein the films are successively formed on the substrate by sputtering, wherein the magnetic film comprises Cr and Co and has a structure in which a number of magnetic grains are separated from one another by a grain boundary phase comprising the same constitutional elements that constitute the magnetic grains, and the intergrain distance in the grain boundary phase is 10 Å or more and wherein a ratio of a Cr concentration ($c_2$) of the grain boundary phase to a Cr concentration ($c_1$) of the magnetic grains, represented by $c_2/c_1$, is 1.4 or higher and the magnetic grains have a grain size of 60–200 Å, and wherein the magnetic film has a multi-layer structure in which magnetic unit layers and non-magnetic unit layers are alternately stacked and a magnetic unit layer is an innermost layer.

2. A magnetic recording medium according to claim 1, wherein the Cr concentration ($c_2$) of the grain boundary phase is 15 at % or higher.

3. A magnetic recording medium according to claim 1, wherein the magnetic film has a magnetic unit layer as an outermost layer.

4. A magnetic recording medium according to claim 1, wherein the sputtering is repeatedly carried out several times by sequentially using at least two different targets formed of different materials in the sputtering to form the magnetic unit layer.

5. A magnetic recording medium comprising (1) a non-magnetic substrate, (2) a non-magnetic undercoat film, (3) a magnetic film, and (4) a protective film, wherein the films are successively formed on the substrate by sputtering, wherein the magnetic film comprises Cr and Co and has a structure in which a number of magnetic grains are separated from one another by a grain boundary phase comprising the same constitutional elements that constitute the magnetic grains, and the intergrain distance in the grain boundary phase is 10 Å or more and wherein a ratio of a Cr concentration ($c_2$) of the grain boundary phase to a Cr concentration ($c_1$) of the magnetic grains, represented by $c_2/c_1$, is 1.4 or higher and the magnetic grains have a grain size of 60–200 Å, and wherein the magnetic film has a multi-layer structure in which magnetic unit layers and non-magnetic layers are alternately stacked and a non-magnetic unit layer is an innermost layer.

6. A magnetic recording medium according to claim 5, wherein the Cr concentration ($c_2$) of the grain boundary phase is 15 at % or higher.

7. A magnetic recording medium according to claim 5, wherein the sputtering is repeatedly carried out several times by sequentially using at least two different targets formed of different materials in the sputtering to form the magnetic unit layer.

8. A magnetic recording medium according to claim 5, wherein the magnetic film has a magnetic unit layer as an outermost layer.

* * * * *